(12) United States Patent
Kim et al.

(10) Patent No.: US 11,268,192 B2
(45) Date of Patent: Mar. 8, 2022

(54) THIN FILM PROCESSING APPARATUS AND THIN FILM PROCESSING METHOD

(71) Applicant: SAMSUNG DISPLAY CO., LTD., Yongin-si (KR)

(72) Inventors: Woo Jin Kim, Hwaseong-si (KR); Dong Kyun Ko, Hwaseong-si (KR); Keun Hee Park, Seoul (KR); Myung Soo Huh, Suwon-si (KR); Seon Uk Park, Hwaseong-si (KR)

(73) Assignee: SAMSUNG DISPLAY CO, LTD., Yongin-si (KR)

( * ) Notice: Subject to any disclaimer, the term of this patent is extended or adjusted under 35 U.S.C. 154(b) by 75 days.

(21) Appl. No.: 16/434,256

(22) Filed: Jun. 7, 2019

(65) Prior Publication Data

US 2019/0390342 A1   Dec. 26, 2019

(30) Foreign Application Priority Data

Jun. 22, 2018   (KR) .................. 10-2018-0071793

(51) Int. Cl.
| | | |
|---|---|---|
| *C23C 16/40* | (2006.01) | |
| *C23C 16/455* | (2006.01) | |
| *C23C 16/50* | (2006.01) | |
| *H01L 51/56* | (2006.01) | |

(52) U.S. Cl.
CPC ...... *C23C 16/45565* (2013.01); *C23C 16/405* (2013.01); *C23C 16/50* (2013.01); *H01L 51/56* (2013.01)

(58) Field of Classification Search
CPC . C23C 16/45565; C23C 16/405; C23C 16/50; C23C 16/45574; C23C 16/45568; H01L 51/56; H01L 21/67011; H01L 21/02189; H01L 21/02274; H01L 27/3241
USPC ............ 118/715; 156/345.1, 345.33, 345.34
See application file for complete search history.

(56) References Cited

U.S. PATENT DOCUMENTS

| | | | | |
|---|---|---|---|---|
| 5,010,842 A | * | 4/1991 | Oda ..................... | C23C 16/452 118/715 |
| 5,480,678 A | * | 1/1996 | Rudolph ................ | C04B 35/83 427/248.1 |
| 5,871,586 A | * | 2/1999 | Crawley ................ | C30B 25/14 118/715 |
| 5,888,907 A | * | 3/1999 | Tomoyasu .......... | H01J 37/3244 438/714 |

(Continued)

FOREIGN PATENT DOCUMENTS

| | | |
|---|---|---|
| KR | 100696021 | 3/2007 |
| KR | 1020080008740 | 1/2008 |

(Continued)

*Primary Examiner* — Rudy Zervigon
(74) *Attorney, Agent, or Firm* — F. Chau & Associates, LLC

(57) ABSTRACT

A thin film processing apparatus includes a susceptor and a showerhead facing the susceptor. The showerhead includes a first plate including an inner tunnel, a first injection hole, and a second injection hole. The inner tunnel extends across the first plate in a thickness direction of the first plate. The first injection hole penetrates a first surface and a second surface of the first plate on opposite sides of the first plate in the thickness direction. The second injection hole penetrates the second surface of the first plate. The second injection is connected with the inner tunnel.

20 Claims, 23 Drawing Sheets

(56) References Cited

U.S. PATENT DOCUMENTS

| | | | | |
|---|---|---|---|---|
| 5,938,333 A * | 8/1999 | Kearney | B01F 5/00 | 366/336 |
| 6,089,472 A * | 7/2000 | Carter | C23C 16/455 | 239/422 |
| 6,333,019 B1 * | 12/2001 | Coppens | B01F 5/06 | 23/293 R |
| 6,435,428 B2 * | 8/2002 | Kim | C23C 16/452 | 239/553 |
| 6,446,573 B2 * | 9/2002 | Hirayama | C23C 16/511 | 118/723 MW |
| 6,499,425 B1 * | 12/2002 | Sandhu | C23C 16/34 | 118/723 E |
| 6,502,530 B1 * | 1/2003 | Turlot | C23C 16/45561 | 118/723 E |
| 6,641,698 B2 * | 11/2003 | Kabansky | H01J 37/32082 | 118/723 ER |
| 6,849,241 B2 * | 2/2005 | Dauelsberg | C23C 16/45514 | 117/102 |
| 6,890,386 B2 * | 5/2005 | DeDontney | C23C 16/4412 | 118/715 |
| 6,921,437 B1 * | 7/2005 | DeDontney | C23C 16/45565 | 118/715 |
| 7,479,303 B2 * | 1/2009 | Byun | C23C 16/45519 | 118/715 |
| 7,537,662 B2 * | 5/2009 | Soininen | C23C 16/4412 | 118/715 |
| 7,601,223 B2 * | 10/2009 | Lindfors | C23C 16/4412 | 118/715 |
| 8,277,561 B2 * | 10/2012 | Kim | C23C 16/45582 | 118/715 |
| 8,481,118 B2 * | 7/2013 | Burrows | C23C 16/45574 | 427/250 |
| 8,539,908 B2 * | 9/2013 | Takagi | C23C 16/45574 | 118/696 |
| 8,778,079 B2 * | 7/2014 | Begarney | H01L 21/67017 | 118/715 |
| 8,869,742 B2 * | 10/2014 | Dhindsa | C23C 16/45576 | 118/723 E |
| 9,057,128 B2 * | 6/2015 | Olgado | C23C 16/45565 | |
| 9,315,897 B2 * | 4/2016 | Byun | C23C 16/45574 | |
| 9,449,859 B2 * | 9/2016 | Song | C23C 16/4411 | |
| 9,469,900 B2 * | 10/2016 | Byun | C23C 16/45572 | |
| 9,476,121 B2 * | 10/2016 | Byun | C23C 16/45578 | |
| 9,587,312 B2 * | 3/2017 | Silva | C23C 16/45572 | |
| 9,663,856 B2 * | 5/2017 | Kasai | H01J 37/32192 | |
| 9,695,508 B2 * | 7/2017 | Carlson | C23C 16/45574 | |
| 9,879,359 B2 * | 1/2018 | Fujibayashi | C23C 16/45553 | |
| 9,887,108 B2 * | 2/2018 | Uchida | H01J 37/3244 | |
| 9,945,031 B2 * | 4/2018 | Jiang | C23C 16/45574 | |
| 10,130,958 B2 * | 11/2018 | Tam | C23C 16/45519 | |
| 10,221,482 B2 * | 3/2019 | Krucken | C23C 16/45574 | |
| 10,316,409 B2 * | 6/2019 | van Schravendijk | C23C 16/45544 | |
| 10,407,772 B2 * | 9/2019 | Yamada | C23C 16/52 | |
| 10,541,145 B2 * | 1/2020 | Ogawa | H01L 21/31116 | |
| 10,626,500 B2 * | 4/2020 | Shah | C23C 16/458 | |
| 10,954,596 B2 * | 3/2021 | Polyak | C23C 16/45565 | |
| 2002/0092471 A1 * | 7/2002 | Kang | C23C 16/4583 | 118/715 |
| 2004/0191413 A1 * | 9/2004 | Park | C23C 16/45536 | 427/255.28 |
| 2005/0158469 A1 * | 7/2005 | Park | C23C 16/45536 | 427/255.23 |
| 2005/0217580 A1 * | 10/2005 | DeDontney | C23C 16/45565 | 118/715 |
| 2006/0263522 A1 * | 11/2006 | Byun | C23C 16/45565 | 427/248.1 |
| 2009/0098276 A1 * | 4/2009 | Burrows | C23C 16/45565 | 427/8 |
| 2009/0162262 A1 * | 6/2009 | Bera | H01J 37/3244 | 422/186.04 |
| 2009/0178615 A1 * | 7/2009 | Kim | C23C 16/45565 | 118/715 |
| 2009/0178616 A1 * | 7/2009 | Byun | C23C 16/45574 | 118/715 |
| 2009/0179085 A1 * | 7/2009 | Carducci | C23C 16/4557 | 239/289 |
| 2010/0003405 A1 * | 1/2010 | Kappeler | C30B 25/14 | 427/255.28 |
| 2010/0300359 A1 * | 12/2010 | Armour | C23C 16/45572 | 118/724 |
| 2011/0023782 A1 * | 2/2011 | Han | C23C 16/45572 | 118/724 |
| 2011/0048325 A1 * | 3/2011 | Choi | C23C 16/452 | 118/712 |
| 2011/0073038 A1 * | 3/2011 | Chien | C23C 16/45574 | 118/715 |
| 2011/0186228 A1 * | 8/2011 | Huang | B23P 15/16 | 156/345.34 |
| 2012/0000490 A1 * | 1/2012 | Chung | C23C 16/4405 | 134/22.12 |
| 2012/0024478 A1 * | 2/2012 | Huang | C23C 16/45565 | 156/345.34 |
| 2014/0235069 A1 * | 8/2014 | Breiling | C23C 16/452 | 438/778 |
| 2015/0000594 A1 * | 1/2015 | Byun | C23C 16/45514 | 118/715 |
| 2015/0368799 A1 * | 12/2015 | Jiang | C23C 16/45574 | 427/255.28 |
| 2020/0032396 A1 * | 1/2020 | Polyak | C23C 16/45544 | |

FOREIGN PATENT DOCUMENTS

| | | |
|---|---|---|
| KR | 100831198 | 5/2008 |
| KR | 1020090011978 | 2/2009 |
| KR | 1020150004769 | 1/2015 |
| KR | 1020150089328 | 8/2015 |

* cited by examiner

THIN FILM PROCESSING APPARATUS AND THIN FILM PROCESSING METHOD

CROSS-REFERENCE TO RELATED APPLICATION

This application claims priority under 35 U.S.C. § 119 to Korean Patent Application No. 10-2018-0071793, filed on Jun. 22, 2018, in the Korean intellectual Property Office, the disclosure of which is incorporated by reference herein in its entirety.

1. Technical Field

Exemplary embodiments of the present invention relate to a thin film processing apparatus, and more particularly, to a thin film processing method.

2. Discussion of Related Art

Various types of display devices have been developed, such as a liquid crystal display (LCD) and an organic light emitting display (OLED).

Among display devices, a liquid crystal display device, which is one of the most widely used flat panel display devices, may include two substrates including electric field generating electrodes such as a pixel electrode and a common electrode and a liquid crystal layer disposed therebetween. In the liquid crystal display device, a voltage may be applied to the electric field generating electrodes to form an electric field in the liquid crystal layer, so that the alignment of liquid crystal molecules in the liquid crystal layer is determined, and the polarization of incident light is controlled, thus displaying an image.

Among display devices, an organic light emitting display device may display an image using an organic light emitting element that emits light by recombination of electrons and holes. The organic light emitting display device may have relatively high response speed, relatively high luminance and a relatively wide viewing angle, while also having relatively low power consumption.

As a method of manufacturing a display device, a chemical vapor deposition (CVD) method may be used. However, thermal deformation of a display may occur in CVD.

SUMMARY

An exemplary embodiment of the present invention provides a thin film processing apparatus including a shower head in which an occurrence of thermal deformation in a display device is reduced or eliminated.

An exemplary embodiment of the present invention provides a thin film processing method in which an occurrence of defects in a display device resulting from thermal deformation is reduced or eliminated.

An exemplary embodiment of the present invention provides a deposition apparatus capable of forming a metal oxide film having a relatively high dielectric constant.

According to an exemplary embodiment of the present invention, a thin film processing apparatus includes a susceptor and a showerhead facing the susceptor. The showerhead includes a first plate including an inner tunnel, a first injection hole, and a second injection hole. The first injection hole penetrates a first surface and a second surface of the first plate on opposite sides of the first plate in a direction orthogonal to the first surface of the first plate. The inner tunnel extends across the first plate in the direction orthogonal to the first surface of the first plate. The second injection hole penetrates the second surface of the first plate. The second injection is connected with the inner tunnel.

According to an exemplary embodiment of the present invention, a thin film processing apparatus includes a susceptor and a showerhead facing the susceptor. The showerhead includes a first plate including an inner tunnel extending in a thickness direction of the first plate. A second plate faces the first plate. The second plate defines a diffusion space between the first plate and the second plate.

According to an exemplary embodiment of the present invention, a thin film processing method includes providing a thin film processing apparatus. The thin film process apparatus includes a susceptor and a showerhead facing the susceptor. The showerhead includes a first plate including an inner tunnel, a first injection hole, and a second injection hole. The first plate is formed of a single plate. A second plate faces the first plate. The second plate defines a diffusion space between the first plate and the second plate. The inner tunnel extends in a thickness direction across the first plate. The first injection hole penetrates a first surface and a second surface of the first plate. The second injection hole penetrates the second surface of the first plate from the inner tunnel in the thickness direction. The method includes injecting a first reaction gas and a second reaction gas into a reaction space between the susceptor and the showerhead through the showerhead. The first reaction gas and the second reaction gas do not come into contact with each other in the showerhead.

According to an exemplary embodiment of the present invention, a showerhead of a thin film processing apparatus includes a first plate, a second plate spaced apart from the first plate, and an edge sidewall connecting the first plate with the second plate. A first gas supply unit is connected with a diffusion space defined between the first plate, the second plate and the edge sidewall. The diffusion space is connected with a first injection hole. A second gas supply unit includes a connecting pipe passing through the diffusion space. The connecting pipe is connected with a second injection hole spaced apart from the first injection hole. The connecting pipe is isolated from the diffusion space.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1:
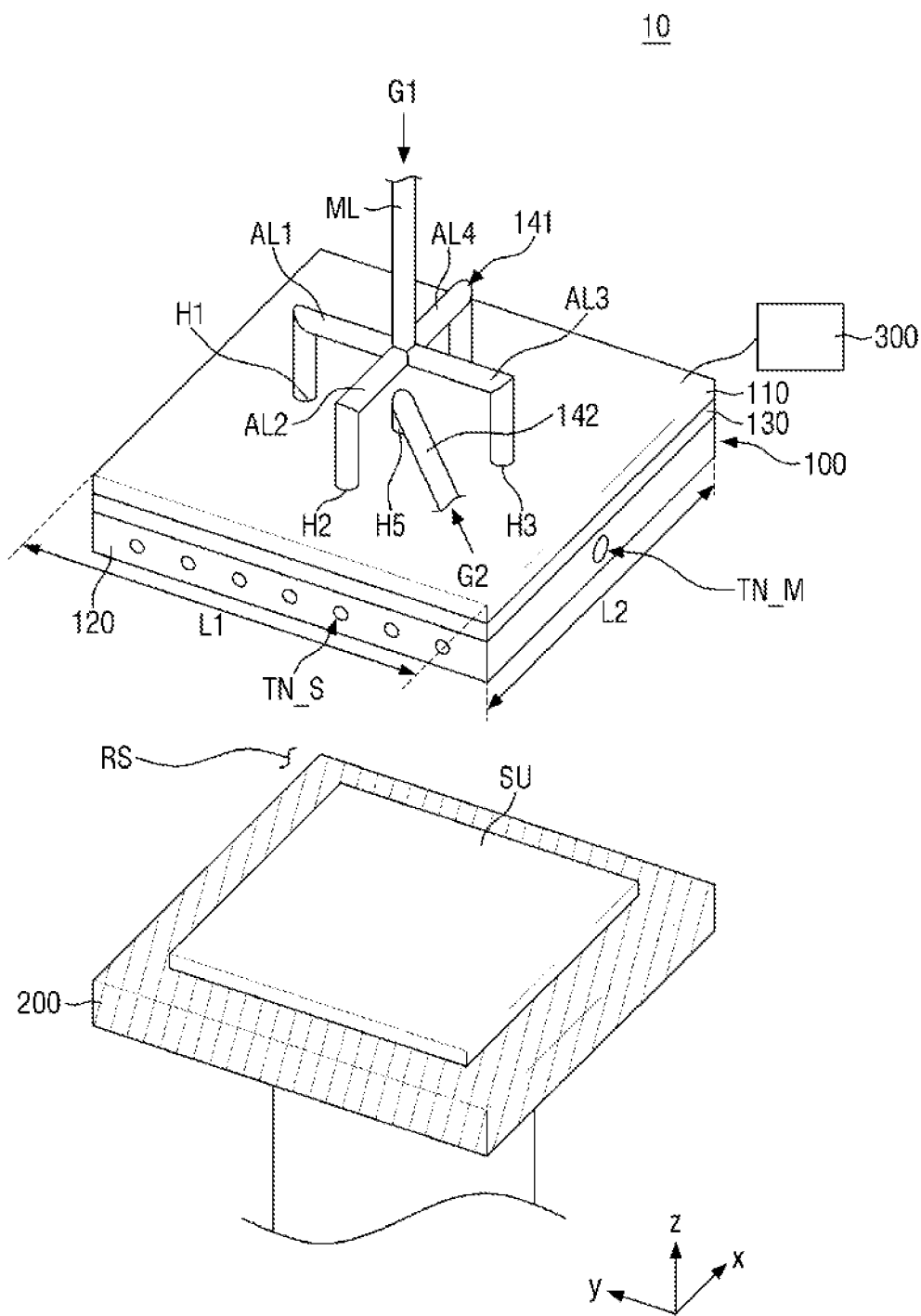
FIG. 1 is a perspective view of a thin film processing apparatus according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

As used herein, the singular forms "a", "an" and "the" may include the plural forms as well, unless the context clearly indicates otherwise.

It will be understood that when a component, such as a layer, a film, a region, or a plate, is referred to as being "on" another component, the component may be directly on the other component or intervening components may be present.

Spatially relative terms, such as "beneath," "below," "lower," "above," and "upper" may be used herein for clarity of description to describe one element or feature's relationship to another element(s) or feature(s) as illustrated in the figures. It will be understood that the spatially relative terms may encompass different orientations of the device in use or operation in addition to the orientation depicted in the figures.

Figure 2:
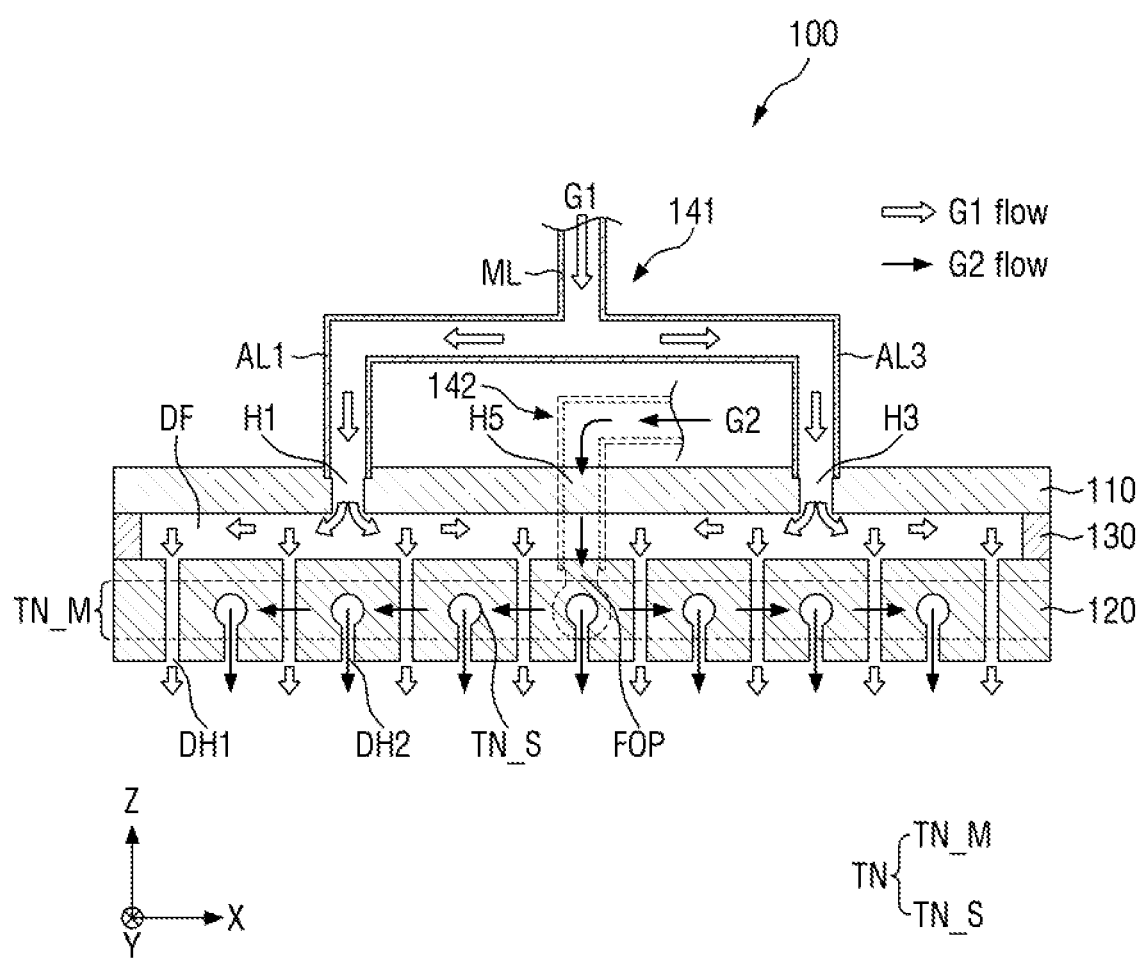
FIG. 2 is a schematic cross-sectional view of a thin film processing apparatus according to an exemplary embodiment of the present invention.

FIG. 1 is a perspective view of a thin film processing apparatus according to an exemplary embodiment of the present invention. FIG. 2 is a schematic cross-sectional view of a thin film processing apparatus according to an exemplary embodiment of the present invention.

In the drawings, a first direction X, a second direction Y, and a third direction Z are illustrated. The first direction X, the second direction Y, and the third direction 7 intersect each other. The third direction Z, which may be a vertical direction, may correspond with a thickness direction of a showerhead, which is described in more detail below. A plane defined by the first direction X and the second direction Y may be referred to as an XY plane. As an example, the first direction X may be perpendicular to the second direction Y. The first direction X and the second direction Y may define a plane. A third direction 7 may be perpendicular to the first and second directions X and Y. Thus, the third direction may be orthogonal to a plane extending in the first and second directions X and Y.

A thin film processing apparatus 10 according to an exemplary embodiment of the present invention may be an apparatus used for performing processes such as thin film formation and thin film patterning when manufacturing a display device, or a semiconductor device. The thin film processing apparatus 10 may be, for example, an apparatus including a showerhead 100, and may be a deposition apparatus or an etching apparatus. The deposition apparatus may be, for example, a chemical vapor deposition (CVD) apparatus, a metal organic chemical vapor deposition (MOCVD) apparatus, a plasma enhanced chemical vapor deposition (PECVD) apparatus, a thermal chemical vapor deposition (TCVD) apparatus, an atmosphere pressure chemical vapor deposition (APCVD) apparatus, a low pressure chemical vapor deposition (LPCVD) apparatus, or an atomic layer deposition (ALD) apparatus. The etching apparatus, as a dry etching apparatus, may be a reactive ion etching (RIE) apparatus, a reactive ion beam etching (RIBE) apparatus, a high density plasma etching (HDPE) apparatus, or a sputter etching apparatus. In an exemplary embodiment of the present invention, a metal organic chemical vapor deposition apparatus used for forming an insulating film of an organic light emitting display device is described as an example of the thin film processing apparatus 10, but exemplary embodiments of the present invention are not limited thereto.

Referring to FIGS. 1 and 2, the thin film processing apparatus 10 may include the showerhead 100, a susceptor 200, and gas supply units 141 and 142. The thin film processing apparatus 10 may include a chamber. As an example, the susceptor 200 may be positioned in the chamber and the showerhead 100 may be positioned at an upper portion of the chamber. As an example, the showerhead 100, the susceptor 200, and a process reaction space RS may be disposed inside the chamber. The inner space of the chamber may maintain a vacuum state. However, exemplary embodiments of the present invention are not limited thereto, and the inner space of the chamber may be at a normal pressure (e.g., substantially equal to an outside air pressure). The chamber may maintain a relatively low pressure lower than the normal pressure or a relatively high pressure higher than the normal pressure (e.g., according to a thin film forming process).

The showerhead 100 and the susceptor 200 may face each other in the third direction Z. A reaction space RS may be defined between the showerhead 100 and the susceptor 200. In an exemplary embodiment of the present invention, the showerhead 100 may be disposed over the reaction space RS, and the susceptor 200 may be disposed thereunder, but exemplary embodiments of the present invention are not limited thereto.

The susceptor 200 may support a target substrate SU to be processed. The target substrate SU may be, for example, an insulating substrate or a semiconductor substrate, which is used for a display device. In an exemplary embodiment of the present invention, the target substrate SU may be a glass substrate or a flexible polymer substrate including polyimide, which is used for an organic light emitting display device. The target substrate SU may be a base substrate itself, but may be a base substrate on which an insulating film or a conductive film is formed.

In an exemplary embodiment of the present invention, the susceptor 200 may include a lifting member that lifts the target substrate SU in the third direction Z. Accordingly, the target substrate SU placed on the susceptor 200 may move upward or downward in the inner space of the chamber, as desired. The susceptor 200 may include a temperature regulating member that changes the temperature of the substrate, or may be connected thereto. The temperature regulating member may include a heating member such as a heater or a cooling member such as cooling water. In an exemplary embodiment of the present invention, the temperature regulating member may include both a heating member and a cooling member, and may further include a temperature control member.

The showerhead 100 may have a square or rectangular shape. Two sides of the showerhead 100, facing each other, may extend in the first direction X, and two other sides of the showerhead 100, facing each other, may extend in the second direction Y. In an exemplary embodiment of the present invention, each of a length L2 of the showerhead 100 in the first direction X and a length L1 of the second direction Y may be from about 300 mm to about 4000 mm, but exemplary embodiments of the present invention are not limited thereto.

The showerhead 100 may include a back plate 110 and a facing plate 120. The facing plate 120 may be a plate facing the reaction space RS. The back plate 110 may be disposed over the facing plate 120 (opposite to the reaction space RS with respect to the facing plate 120). As an example, the back plate 110 may be spaced apart from the facing plate 120.

The back plate 110 and the facing plate 120 may be disposed to overlap each other along the third direction Z. In an exemplary embodiment of the present invention, the planar shapes of the back plate 110 and the facing plate 120 may be substantially identical to each other. Further, sizes of each of the back plate 110 and the facing plate 120 may be substantially identical to each other in the X and Y directions.

The back plate 110 and the facing plate 120 may be spaced apart from each other. The back plate 110 and the lacing plate 120 may be disposed substantially in-parallel with each other. Each of the back plate 110 and the facing plate 120 may be disposed on a plane parallel to the XY plane. An edge sidewall 130 may be disposed along the edge between the back plate 110 and the facing plate 120 to define a diffusion space DF. The diffusion space DF may be defined by the lower surface of the back plate 110, the upper surface of the facing plate 120, and the edge side wall 130. The diffusion space DF may be an airtight space configured to hold a reaction gas.

In an exemplary embodiment of the present invention, the edge side wall 130 may be disposed between the back plate 110 and the facing plate 120 and may serve as a spacer for maintaining the space between the back plate 110 and the facing plate 120.

In an exemplary embodiment of the present invention, the edge sidewall 130 may be disposed to surround the side surfaces of the back plate 110 and the facing plate 120. Thus, the edge sidewall 130 may be in direct contact with side surfaces of the back plate 110 and the facing plate 120.

The edge side wall 130 may be coupled with the back plate 110 and the facing plate 120 through a coupling member. The boundary between the back plate 110 and the facing plate 120 coupled with the edge side wall 130 may be sealed so that gas cannot flow in and out.

In an exemplary embodiment of the present invention, the edge side wall 130 may be formed of a separate member from the back plate 110 and the facing plate 120. However, exemplary embodiments of the present invention are not limited thereto, and the edge side wall 130 may be integrated with the back plate 110 or integrated with the facing plate 120. For example, when the edge side wall is integrated with the facing plate 120, the facing plate 120 includes a flat bottom portion and a side wall portion curved at the edge thereof, and the side wall portion of the facing plate 120 may coupled to the back plate 110 through a coupling member.

The facing plate 120 may include at least one inner tunnel TN. The inner tunnel TN may be disposed in a middle area in the thickness direction (e.g., along the third direction Z) of the facing plate 120, and may extend in a direction crossing the thickness direction (e.g., perpendicular to the thickness direction). The inner tunnel TN may extend along a direction extending along the XY plane (e.g., or a plane parallel thereto). In an exemplary embodiment of the present invention, a portion TN_S of the inner tunnel TN may extend along the first direction X, and another portion TN_M of the inner tunnel TN may extend along the second direction Y.

The showerhead 100 may include or may define the diffusion space DF and the internal tunnel TN space along the third direction Z. The diffusion space DF and the inner tunnel TN of the facing plate 120 may be separated from each other. For example, the diffusion space DF and the inner tunnel TN of the facing plate 120 may be isolated from each other so that there is an airtight separation between the diffusion space DF and the inner tunnel TN. Therefore, when a first reaction gas G1 is introduced into the diffusion space DF and a second reaction gas G2 is introduced into the inner tunnel TN of the facing plate 120, the first reaction gas G1 and the second reaction gas G2 need not be mixed with each other in the showerhead 100. Thus, the first reaction gas G1 and the second reaction gas G2 might not come into contact with each other in the showerhead 100.

The facing plate 120 may include a plurality of injection holes DH1 and DH2. The injection holes DH1 and DH2 may be gas outlets for discharging the reaction gases introduced into the showerhead 100 into the reaction space RS. The injection holes DH1 and DH2 may have a shape extending substantially along the third direction Z. The injection holes DH1 and DH2 may be spaced apart from each other, and isolated from each other so that reaction gasses passing respectively passing through the injection holes DH1 and DH2 do not come into contact with each other in the showerhead 100.

The plurality of injection holes may include a plurality of first injection holes DH1 and a plurality of second injection holes DH2. The first injection holes DH1 and the second injection holes DH2 may each be opened at the lower surface of the facing plate 120 facing the reaction space RS.

The first injection hole DH1 may penetrate the upper surface and lower surface of the facing plate 120 to connect the diffusion space DF and the reaction space RS. Thus, the first injection hole DH1 may continually extend from the diffusion space DF to the lower surface of the facing plate 120 (e.g., along the thickness of the facing plate 120, which may be along the third direction Z). The second injection hole DH2 may penetrate the inner tunnel TN of the facing plate 120 and the lower surface of the facing plate 120 to connect the inner tunnel TN of the facing plate 120 and the reaction space RS. Thus, the second injection hole DH2 may continually extend from the inner tunnel TN to the lower surface of the facing plate 120 (e.g., along the thickness of the facing plate 120, which may be along the third direction Z). In the showerhead 100, the first injection hole DH1 and the second injection hole DH2 may be separated from each other without being connected to each other.

In an exemplary embodiment of the present invention, the facing plate 120 may be one integrated plate. For example, the facing plate 120 may be provided in the form of a single plate without laminating or welding of a plurality of plates. When the facing plate 120 is formed of a single plate, the facing plate 120 may have a uniform thermal expansion rate over the entire facing plate 120 as well as having robust mechanical properties, compared to when the facing plate 120 is formed of a plurality of plates. Therefore, when the facing plate 120 is formed of a single plate, an occurrence of a thermal deformation of the facing plate 120 may be reduced or eliminated, and an occurrence of irregular deformation of injection holes may be reduced or eliminated compared to when the facing plate includes a plurality of plates.

The inner tunnel TN or the plurality of injection holes DH1 and DH2 may be formed by a drilling process. Details of drilling process will be described in more detail below.

The thickness THK of the facing plate 120 may be from about 20 mm to about 25 mm. Alternatively, the thickness of the facing plate 120 may be more than 25 mm. For example, the thickness of the facing plate 120 may be from about 25 mm to about 100 mm. However, exemplary embodiments of the present invention are not limited thereto, and the thickness of the facing plate 120 may vary, as desired.

The back plate 110 and the facing plate 120 may each include, but are not limited to, aluminum, aluminum alloy, or stainless steel (SUS). The back plate 110 and the facing plate 120 may include a same material as each other, but may also include different materials.

The gas supply units may include a first gas supply unit 141 for introducing the first reaction gas G1 and a second gas supply unit 142 for introducing the second reaction gas G2. When the thin film processing apparatus 10 is a thin film deposition apparatus for forming an oxide film, the first reaction gas G1 may include a metal precursor including zirconium (Zr), hafnium (HF), or titanium (Ti). For example, the first reaction gas G1 may include at least one selected from $Zr(N(CH_3)_2(C_2H_5))_3$, $Zr(N(CH_3)C_2H_5)_4$, $Zr(OC(CH_3)_3)_4$, $Ti(N(CH_3)_2(C_2H_5))$, $Hf(N(CH_3)_3(C_2H_5))_3$, $Hf(N(CH_3)C_2H_5))_4$, or $Hf(OC(CH_3)_3)_4$. The second reaction gas G2 may include oxygen ($O_2$) and/or nitrous oxide ($N_2O$). The oxide film formed by the introduction of the first reaction gas G1 and the second reaction gas G2 may include zirconium oxide ($ZrO_2$), hafnium oxide ($HfO_2$), or titanium oxide ($TiO_2$). The oxide films deposited using the metal precursors may be high-dielectric (high-k) oxide films having a dielectric constant of from 10 to 50.

The first gas supply unit 141 may introduce the first reaction gas G1 into the diffusion space DF. The second gas supply unit 142 may introduce the second reaction gas G2 into the inner tunnel TN of the facing plate 120. Each of the first gas supply unit 141 and the second gas supply unit 142 may include a flow pipe. The flow pipe may be connected to the inner space of the showerhead 100 through holes penetrating the showerhead 100 in the thickness direction.

In an exemplary embodiment of the present invention, the back plate 110 may include one or more through-holes H1, H2, H3, H4, or H5. The through-holes H1, H2, H3, H4, and H5 may penetrate the upper surface and/or lower surface of the back plate 110. The through-holes H1, H2, H3, H4, and H5 may be gas inlets for introducing the reaction gas into the showerhead 100.

Some of the through-holes formed in the back plate 110 may be used to introduce the first reaction gas G1. For example, the first through-hole H1, the second through-hole H2, the third through-hole H3, and the fourth through-hole H4 may be used to introduce the first reaction gas G1. The flow pipes of the first gas supply unit 141 may be connected to the first to fourth through-holes H1, H2, H3, and H4, respectively.

The first to fourth through-holes H1, H2, H3, and H4 may be spaced apart from each other at predetermined intervals, and may be substantially uniformly arranged over the entire back plate 110. For example, the first to fourth through-holes H1, H2, H3, and H4 may be arranged to be spaced apart from the center of the hack plate 110 toward the corner thereof by a predetermined distance. As such, when the first to fourth through-holes H1, H2, H3 and H4 are arranged to be spread substantially evenly on a plane (e.g., the X Y plane), the first reaction gas G1 may sufficiently diffused toward the corner portion in the diffusion space DF. Therefore, even when the first reaction gas G1 includes an element such as zirconium which has a relatively heavy weight that does not easily diffuse, it is possible to provide substantially uniform first reaction gas G1 for each region of the reaction space RS. Thus, for example, even when the process of depositing the zirconium oxide film on a relatively large area target substrate SU is performed, the uniformity of film formation can be increased as a whole.

The flow pipe of the first gas supply unit 141 may include a main line ML and a plurality of auxiliary lines AL1, AL2, AL3, and AL4 connected to the main line ML. The auxiliary lines AL1, AL2, AL3, and AL4 may be connected to the first to fourth through-holes H1, H2, H3, and H4, respectively. Details of the flow pipe of the first gas supply unit 141 will be described in more detail below.

Some of the through-holes formed in the back plate 110 may be used to introduce the second reaction gas G2. The fifth through-hole H5 may be used to introduce the second reaction gas G2. The flow pipe of the second gas supply unit 142 may pass through the fifth through-hole H5, and may traverse the diffusion space DF between the back plate 110 and the facing plate 120 in the third direction Z. The second gas supply unit 142 may include an inflow opening FOP of the facing plate 120 to connect the flow pipe of the second gas supply unit 142 to the inner tunnel TN of the facing plate 120. The inflow opening FOP may penetrate the space from the upper surface of the facing plate 120 to the inner tunnel TN of the facing plate 120 in the thickness direction (e.g., alone the third direction Z). The flow pipe of the second gas supply unit 142, entering the diffusion space DF, may be connected to the inflow opening FOP of the facing plate 120.

The first reaction gas G1 may be supplied to the reaction space RS through the first injection hole DH1 after entering the diffusion space DF through the first gas supply unit 141. The second reaction gas G2 may be supplied to the reaction space RS through the second injection hole DH2 after entering the inner tunnel TN of the facing plate through the second gas supply unit 142. Accordingly, the first reaction gas G1 and the second reaction gas G2 may be maintained to be isolated from each other in the procedure of being supplied to the reaction space RS through the showerhead 100. For example, the first reaction gas G1 and the second reaction gas G2 need not meet each other (e.g., do not come into contact with each other) while passing through the showerhead 100. However, the first reaction gas G1 and the second reaction gas G2 may come into contact with each other in the reaction space RS after exiting the showerhead 100.

In an exemplary embodiment of the present invention, the first reaction gas G1 and the second reaction gas G2 may be mixed and reacted in the reaction space RS. For example, when the thin film processing apparatus 10 is a deposition apparatus for forming a zirconium oxide film, which is one of the insulating films of an organic light emitting display, the first reaction gas G1 including a zirconium-containing organic metal precursor such as $Zr(N(CH_3)_2(C_2H_2)_3$, $Zr(N(CH_3)C_2H_5)_4$, or $Zr(OC(CH_3)_3)_4$ and the second reaction gas G2 including oxygen ($O_2$) or nitrous oxide ($N_2O$) may be used. The zirconium oxide component of the first reaction gas G1 and the oxygen component of the second reaction gas G2 may be deposited together on the target substrate SU to form a zirconium oxide thin film. The first reaction gas G1 and the second reaction gas G2 may react with each other to form a zirconium oxide even when they meet in a space other than the target substrate SU. The zirconium oxide formed in this way may form particles. The first reaction gas G1 and the second reaction gas G2, having passed through the showerhead 100, may meet each other in the reaction space RS to form particles, but need not meet each other in the diffusion space DF, inner tunnel TN, injection holes DF1 and DF2 in the showerhead 100. Thus, it is possible to prevent the formation of zirconium oxide particles inside the showerhead 100.

In an exemplary embodiment of the present invention, the thin film processing apparatus 10, which is a processing apparatus using plasma, may include a power supply unit 300 and/or a plasma generating electrode. The power supply unit 300 may apply radio frequency (RF) power to the plasma generating electrode. The plasma generating electrode may be provided over the showerhead 100, or may be provided to be integrated with the showerhead 100. An example in which the plasma generating electrode is integrated with the showerhead 100 includes, but is not limited to, an example in which the back plate 110 and/or facing plate 120 of the showerhead 100 include a conductive material to be directly used as the plasma generating electrode. An example in which the plasma generating electrode is integrated with the showerhead 100 includes, but is not limited to, an example in which the plasma generating electrode is embedded in the back plate 110 and/or the facing plate 120.

According to an exemplary embodiment of the present invention, a showerhead of (e.g., showerhead 100) a thin film processing apparatus (e.g., thin film processing apparatus 10) may include a first plate (e.g., the facing plate 120), a second plate (e.g., the back plate 110) spaced apart from the first plate, and an edge sidewall (e.g., edge sidewall 130) connecting the first plate with the second plate. A first gas supply unit (e.g., gas supply unit 141) may be connected with a diffusion space DF defined between the first plate, the second plate and the edge sidewall. The diffusion space DF may be connected with a first injection hole (e.g., injection hole DH1). A second gas supply unit (e.g., gas supply unit 142) may include a connecting pipe (see, e.g., the connecting pipe in hole H5) passing through the diffusion space DF. The connecting pipe may be connected with a second injection hole (e.g., injection hole DH2) spaced apart from the first injection hole. The connecting pipe may be isolated from the diffusion space DF (see, e.g., FIG. 2). Thus, the first injection hole may be isolated from the second injection hole in the first plate. Accordingly, first and second reaction gases respectively provided from the first gas supply unit and the second gas supply unit do not come into contact with each other while passing through the showerhead.

Figure 3:
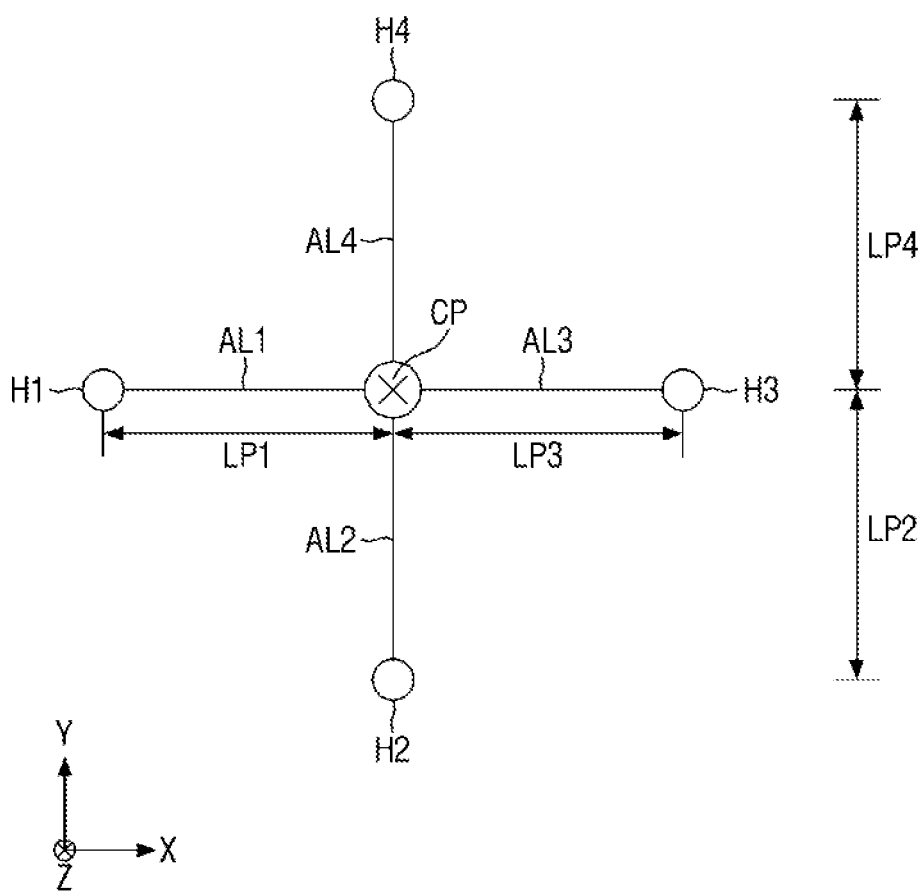
FIG. 3 is a schematic view of a movement path of a first reaction gas in a flow pipe of a first gas supply unit according to an exemplary embodiment of the present invention.

FIG. 3 is a schematic view of a movement path of a first reaction gas in a flow pipe of a first gas supply unit according to an exemplary embodiment of the present invention.

Referring to FIGS. 1 to 3, the flow pipe of the first gas supply unit 141 may include a main lure ML, and first to fourth auxiliary lines AL1, AL2, AL3, and AL4 branched from the main line ML. The first to fourth auxiliary lines AL1, AL2, AL3, and AL4 may be branched from the main line ML at the same position. The first to fourth auxiliary lines AL1, AL2, AL3, and AL4 may be connected to the first to fourth through-holes H1, H2, H3, and H4 of the back plate 110, respectively. The first reaction gas G1 may be introduced into the diffusion space DF through the main line ML and any of the first to fourth auxiliary lines AL1, AL2, AL3, and AL4.

The path length in which the first reaction gas G1 travels to the diffusion space DF through the flow pipe of the first gas supply unit 141 may be the sum of the path length of the main line ML and the path length of the corresponding auxiliary line. Here, the "path" in the path length may be linear and/or bent, and the "path length" may be calculated as the total distance moving along the corresponding path.

Since the length of the main line ML in the path length of the first reaction gas G1 may be common to the first to fourth auxiliary lines AL1, AL2, AL3, and AL4, the deviation of the path length of the first reaction gas G1 having passed through each of the through-holes H1, H2, H3, and H4 may be determined by the path lengths from the central branch point CP to the through-holes H1, H2, H3, and H4. For example, gas passing through any of first to fourth auxiliary lines AL1, AL2, AL3, and AL4 may have previously passed through the main line commonly connected to each of the first to fourth auxiliary lines AL1, AL2, AL3, and AL4.

In an exemplary embodiment of the present invention, the first path length LP1, which is a length of the first auxiliary line AL1 from the central branch point CP to the first through-hole H1, the second path length LP2, which is a length of the second auxiliary line AL2 from the central branch point CP to the second through-hole H2, the third path length LP3, which is a length of the third auxiliary line AL3 from the central branch point CP to the third through-hole H3, and the fourth path length LP4, which is a length of the fourth auxiliary line AL4 from the central branch point CP to the fourth through-hole H4, may be substantially equal to each other. When the first path length LP1, the second path length LP2, the third path length LP3, and the fourth path length LP4 are substantially equal to each other, the flow rate and/or flow velocity of the first reaction gas G1 entering the diffusion space DF through each of the through-holes H1, H2, H3, and, H4 can be uniformly controlled. Therefore, the uniform diffusion of the first reaction gas G1 for each region can be achieved in the diffusion space DF. Thus, it is possible to substantially uniformly provide the first reaction gas G1 to each region of the reaction space RS.

The facing plate 120 will be described in more detail below.

Figure 4:
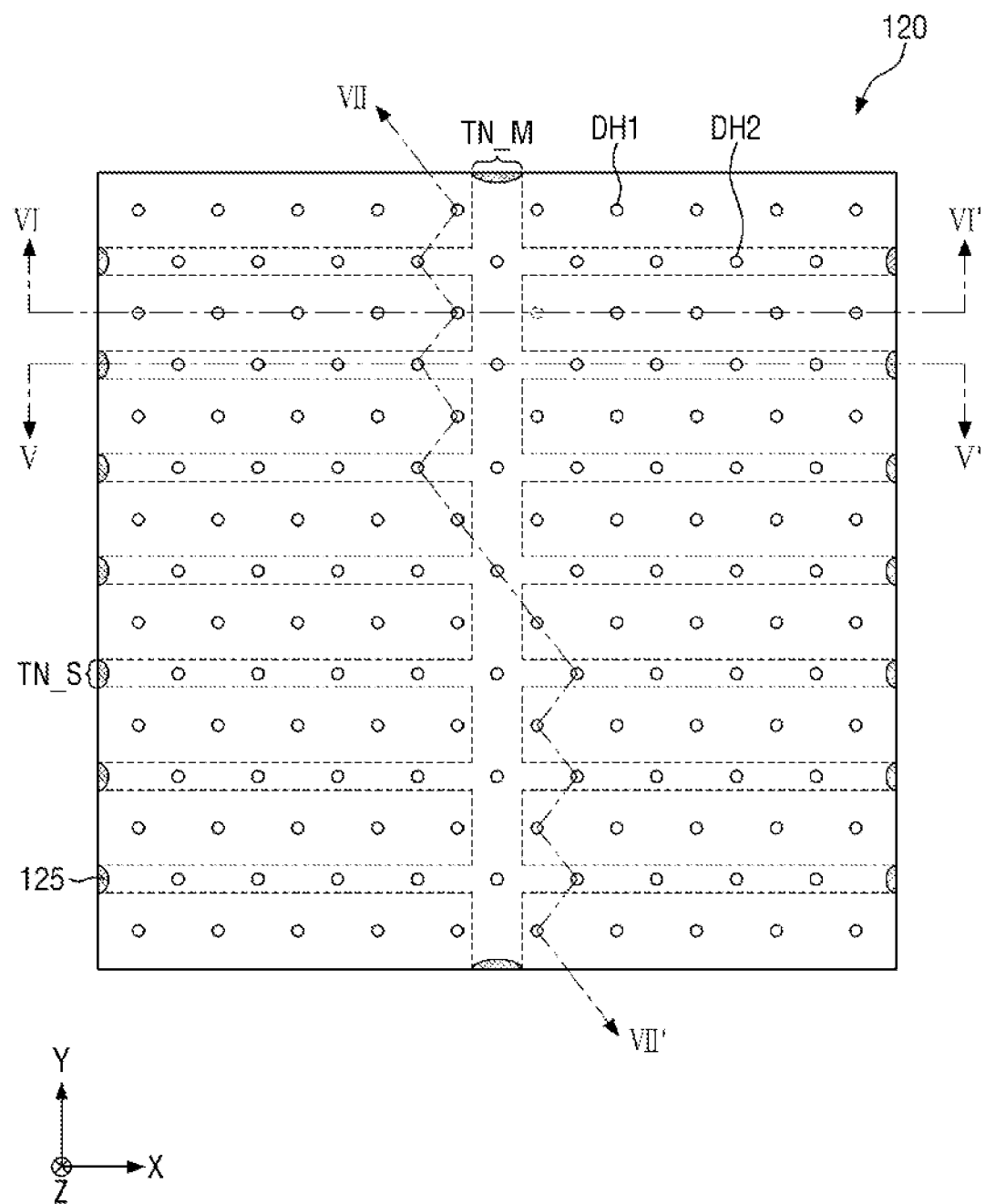
FIG. 4 is a bottom view of a facing plate of a showerhead of FIG. 1 according to an exemplary embodiment of the present invention.
Figure 5:
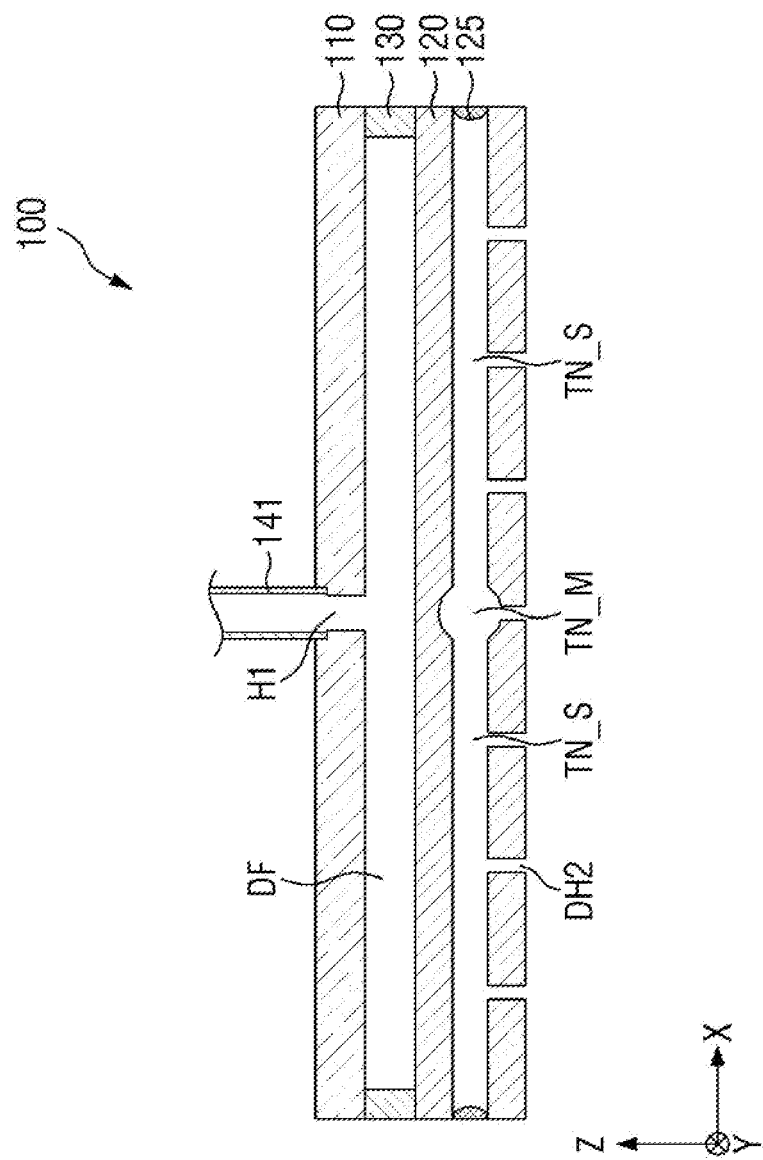
FIG. 5 is a cross-sectional view taken along the line V-V' of FIG. 4.
Figure 6:
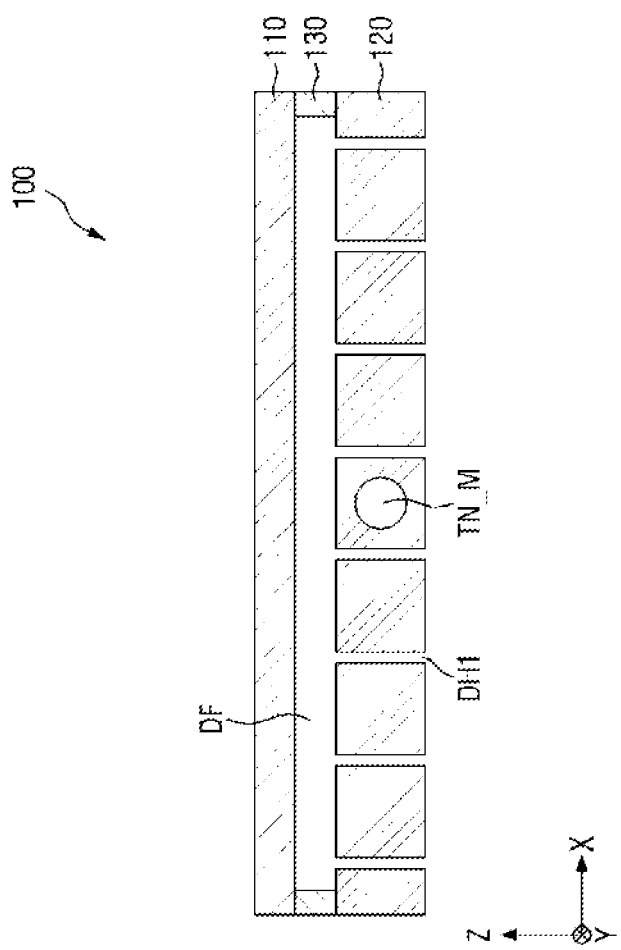
FIG. 6 is a cross-sectional view taken along the line VI-VI' of FIG. 4.
Figure 7:
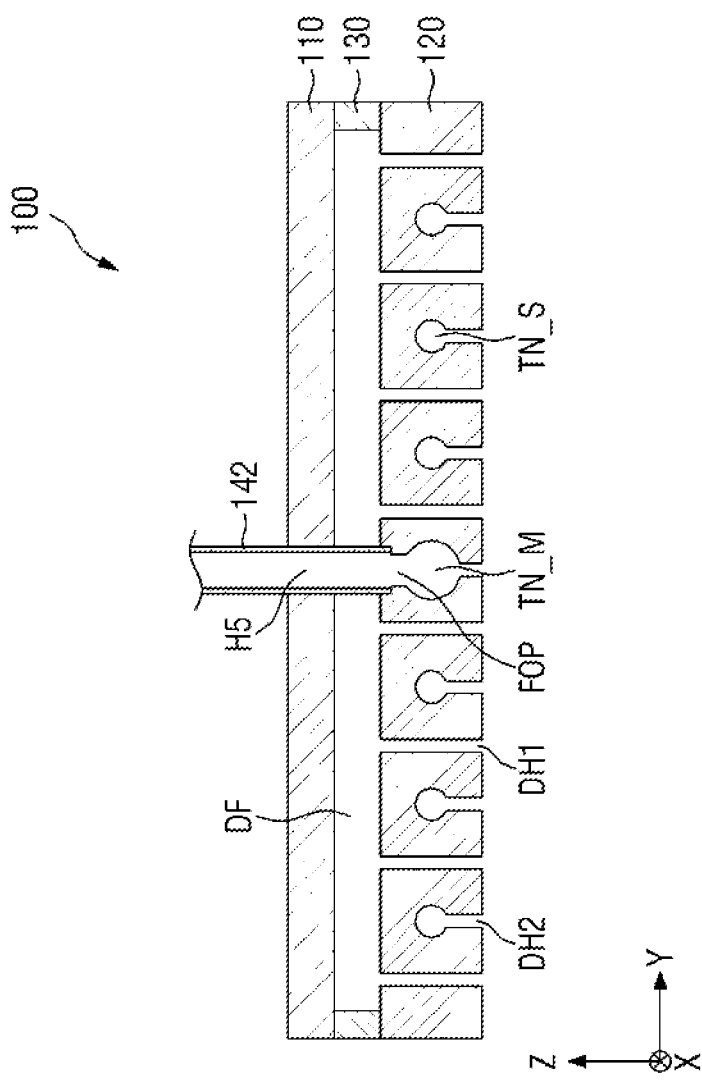
FIG. 7 is a cross-sectional view taken along the line VII-VII' of FIG. 4.
Figure 8:
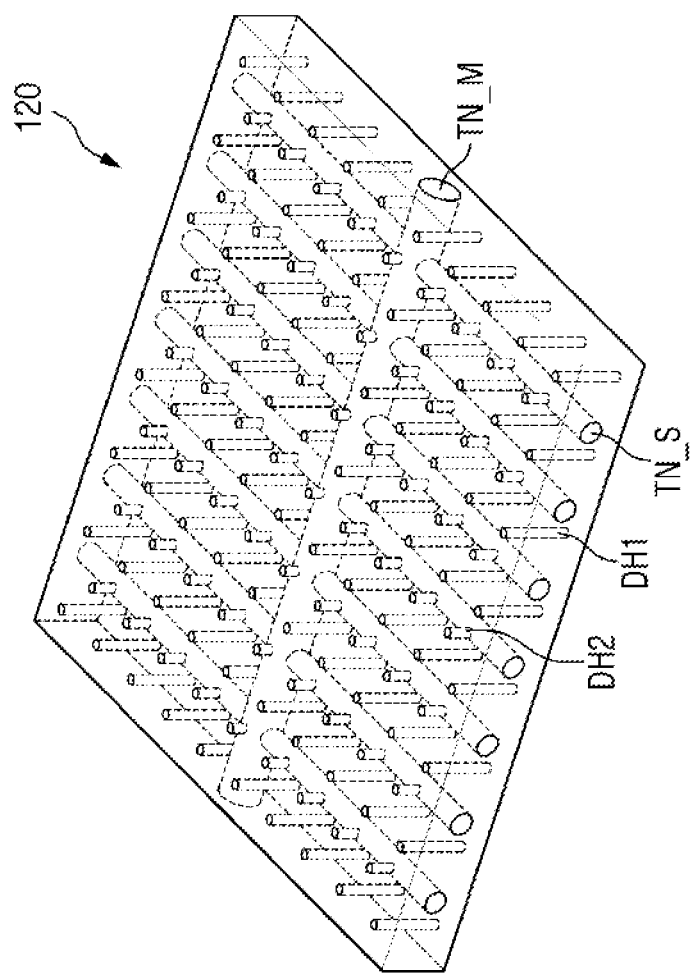
FIG. 8 is a bottom perspective view of a facing plate of a showerhead according to an exemplary embodiment of the present invention.
Figure 9:
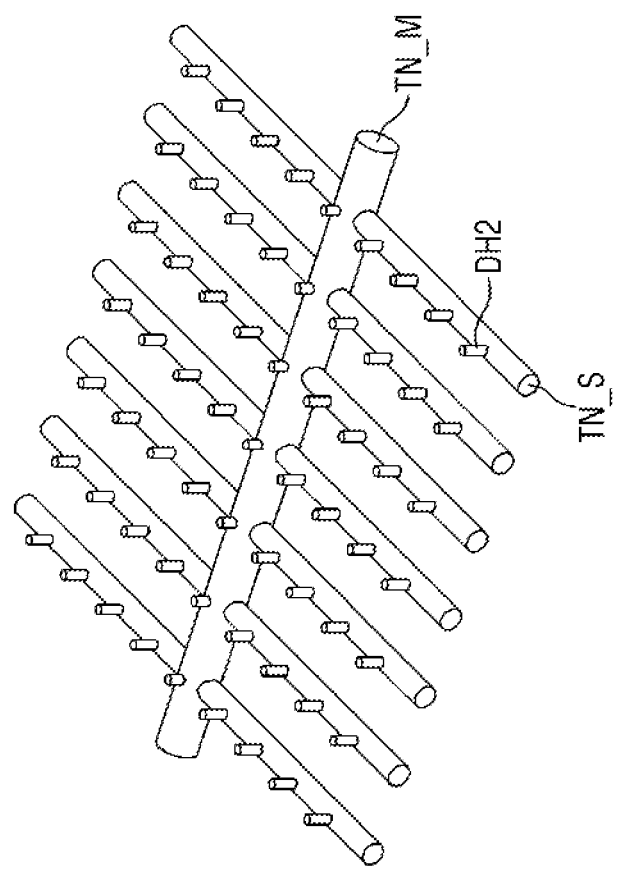
FIG. 9 is a perspective view of holes through which a second reaction gas moves in FIG. 8 according to an exemplary embodiment of the present invention.
Figure 10:
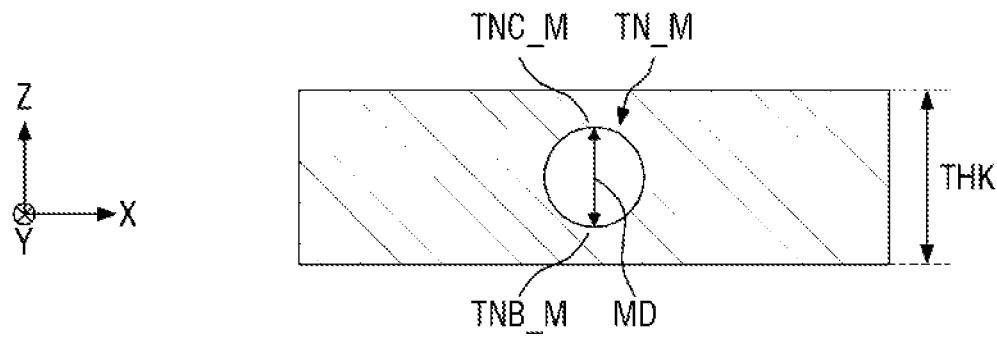
FIG. 10 is a view of a main tunnel, a sub-tunnel and injection holes of a facing plate of a showerhead according to an exemplary embodiment of the present invention.
Figure 10:
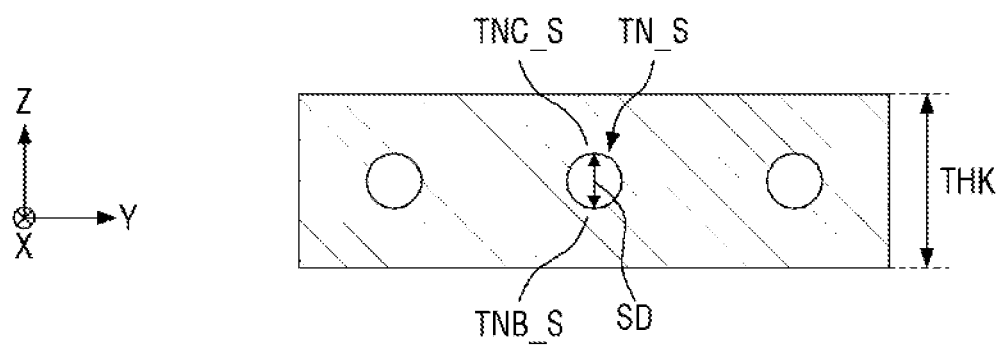
Figure 10:
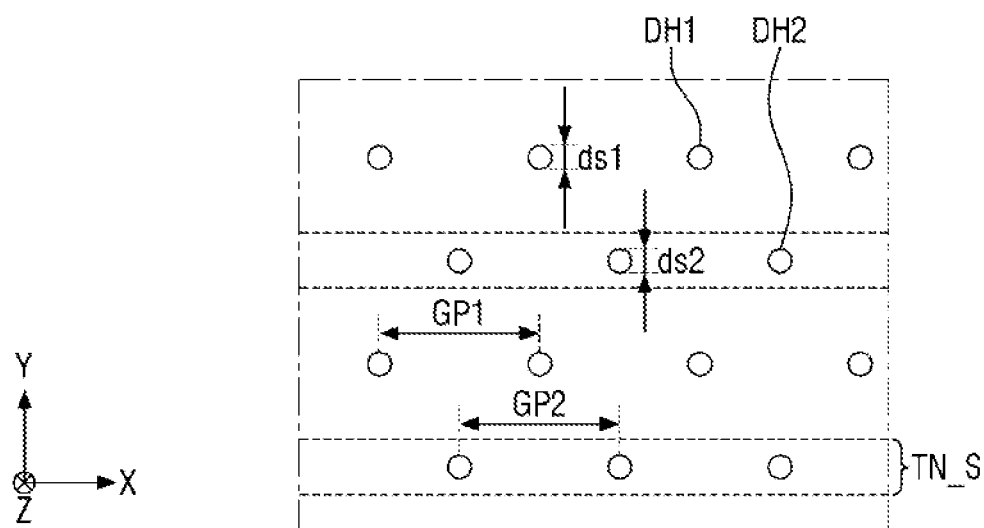

FIG. 4 is a bottom view of a facing plate of a showerhead of FIG. 1 according to an exemplary embodiment of the present invention. FIG. 5 is a cross-sectional view taken along the line V-V' of FIG. 4. FIG. 6 is a cross-sectional view taken along the line VI-VI' of FIG. 4. FIG. 7 is a cross-sectional view taken along the line VII-VII' of FIG. 4. FIG. 8 is a bottom perspective view of a facing plate of a showerhead according to an exemplary embodiment of the present invention. FIG. 9 is a perspective view of holes through which a second reaction gas moves in FIG. 8 according to an exemplary embodiment of the present invention. FIG. 10 is a view of a main tunnel, a sub-tunnel and injection holes of a facing plate of a showerhead according to an exemplary embodiment of the present invention.

Referring to FIGS. 4 to 10, the inner tunnel TN of the facing plate 120 may include at least one main tunnel TN_M and at least one sub tunnel TN_S connected to the main tunnel TN_M. Although one main tunnel TN_M and fourteen sub tunnels TN_S may be provided, the number of the main tunnels TN_M and the sub tunnels TN_S is not limited thereto.

Each of the main tunnel TN_M and the sub tunnel TN_S may be disposed in the middle area of the facing plate 120 in the thickness direction (e.g., along the third direction Z). The "middle area in the thickness direction" may refer to an area spaced apart from upper and lower surfaces of the facing plate 120, which are ends in the thickness direction, without being not in contact with the upper and lower surfaces. The main tunnel TN_M and the sub tunnel TN_S may be spaced apart from the upper surface and lower surface of the facing plate 120, respectively. When the area from the main tunnel TN_M and the sub-tunnel TN_S to the upper surface of the facing plate 120 is defined as a cover area TNC_S and the area from the main tunnel TN_M and the sub tunnel TN_S to the lower surface of the facing plate 120 is defined as a bottom area TNB_M or TNB_S, each of the cover area TNC_M or TNC_S and bottom area TNB_M or TNB_S of the main tunnel TN_M and the sub tunnel TN_S may have a predetermined thickness. When the facing plate 120 is formed as a single plate, the cover area TNC_M or TNC_S and bottom area TNB_M or TNB_S of the main tunnel TN_M and the sub tunnel TN_S may each include a same material as the inner tunnel TN.

In an exemplary embodiment of the present invention, the thickness of the cover area TNC_M of the main tunnel TN_M may be substantially equal to the thickness of the bottom are TNB_M of the main tunnel TN_M. The main tunnel TN_M may be disposed substantially at the center of the facing plate 120 in the thickness direction. The sub tunnel TN_S may also be disposed substantially at the center of the facing plate 120 in the thickness direction, so that the thickness of the cover area TNC_S may be substantially equal to the thickness of the bottom area TNB_S. However, exemplary embodiments of the present invention are not limited thereto, and the main tunnel TN_M and the sub tunnel TN_S may be disposed closer to the upper surface or the lower surface of the facing plate 120.

In an exemplary embodiment of the present invention, the center lines of the main tunnel TN_M and the sub tunnel TN_S in the thickness direction may be disposed on a same plane as each other. The plane on which the center lines of the main tunnel TN_M and the sub tunnel TN_S are disposed in the thickness direction may be the XY plane.

The cross-sectional shape of each of the main tunnel TN_M and the sub-tunnel TN_S (e.g., cross-sectional shape taken along the direction perpendicular to the extending direction) may be substantially circular, but exemplary embodiments of the present invention are not limited thereto. The overall shape of each of the main tunnel TN_M and the sub tunnel TN_S may be substantially cylindrical. In an exemplary embodiment of the present invention, the diameter MD of the main tunnel TN_M may be greater than the diameter SD of the sub tunnel TN_S. The diameter MD of the main tunnel TN_M may be two times or more of the diameter SD of the sub tunnel TN_S. For example, the diameter MD of the main tunnel TN_M may be from about 20 mm to about 40 mm, and the diameter SD of the sub tunnel TN_S may be from about 5 mm to about 20 mm.

The main tunnel TN_M may be disposed substantially at the center of the width of the facing plate 120 in the first direction X. The main tunnel TN_M may traverse both side surfaces of the facing plate 120 extending in the first direction X. The extending direction of the main tunnel TN_M may be the second direction Y. The main tunnel TN_M may bisect the facing plate 120 in a plan view (e.g., along the third direction Z).

The sub tunnel TN_S may traverse between one side of the facing plate 120 extending in the second direction Y and the main tunnel TN_M. The sub tunnel TN_S may be connected to the main tunnel TN_M. The sub tunnel TN_S may extend in the first direction X. The extension directions of the respective sub tunnels TN_S may be the same as each other. The sub-tunnel TN_S located at one side of the main tunnel TN_M may be aligned with an extension line of the sub-tunnel TN_S located at the other side thereof, but exemplary embodiments of the present invention are not limited thereto.

The plurality of sub tunnels TN_S may be arranged at a substantially constant pitch along the first direction X. For example, the pitch of the sub tunnel TN_S may be from about 5 mm to about 50 mm.

The inflow opening FOP to which the flow pipe of the second gas supply unit 142 is connected may be disposed in the cover area TNC_M of the main tunnel TN_M. The inflow opening FOP may be provided to penetrate the cover area TNC_M of the main tunnel TN_M. As an example, one inflow opening FOP may be disposed at the center of the main tunnel TN_M, and a plurality of inflow openings spaced apart from each other may be disposed in the main tunnel TN_M. The plurality of inflow openings may be arranged symmetrically with respect to the central portion of the main tunnel TN_M, so that the flow rate of the second reaction gas G2 flowing in the main tunnel TN_M can be controlled similarly for each region.

At least one second injection hole DH2 may be connected to each sub-tunnel TN_S. The second injection hole DH2 may pass through the bottom area TNB_S of the sub-tunnel TN_S. The second injection hole DH2 may extend in the third direction Z, and the cross-sectional shape of the second injection hole DH2 taken along the direction perpendicular to the extending direction may be substantially circular. The diameter ds2 of the second injection hole DH2 may be smaller than the diameter SD of the sub tunnel TN_S, and, in an exemplary embodiment of the present invention, may be from about 0.4 mm to about 5 mm. The length of the second injection hole DH2 connected to the sub tunnel in the third direction Z may be substantially equal to the thickness of the bottom area TNB_S of the sub tunnel TN_S. As an example, the length of the second injection hole DH2 connected to the sub-tunnel TN_S may be about 5 mm or more. When the length of the second injection hole DH2 connected to the sub-tunnel TN_S is about 5 mm or more, a desired injection direction of the second reaction gas G2 within a predetermined range may be maintained. For example, the second reaction gas G2 may be injected along the extending direction of the second injection hole DH2.

The plurality of second injection holes DH2 in one sub-tunnel TN_S may be spaced apart from each other at substantially equal intervals. Alternatively, spacing between the second injection holes DH2 may be varied. The pitch GP2 of the plurality of second injection holes DH2 arranged in one sub-tunnel TN_S may be from about 5 mm to about 50 mm. The intervals of the second injection holes DH2 arranged in one sub-tunnel TN_S in the second direction Y may be substantially the same as each other, and the intervals of the second injection holes DH2 arranged in the adjacent sub tunnel TN_S in the first direction X may also be substantially the same as each other. Thus, the second injection holes DH2 may be arranged at regular intervals along the first direction X and the second direction Y over the entire facing plate 120. The second reaction gas G2 may be uniformly injected into the reaction space RS through the regular arrangement of the second injection holes DH2.

In an exemplary embodiment of the present invention, at least one second injection hole DH2 may be connected to the main tunnel TN_M. The second injection hole DH2 may penetrate the bottom area TNB_M of the main tunnel TN_M. The size and pitch of the second injection hole DH2 connected to the main tunnel TN_M may be substantially the same as those of the second injection hole DH2 disposed in the sub tunnel TN_S. However, exemplary embodiments of the present invention are not limited thereto, and the second injection hole DH2 of the main tunnel TN_M may be omitted.

Descriptions of technical features or aspects of an exemplary embodiment of the present invention should typically be considered as available and applicable to other similar features or aspects in another exemplary embodiment of the present invention. Accordingly, technical features described herein according to one exemplary embodiment of the present invention may be applicable to other exemplary embodiments of the present invention, and thus duplicative descriptions may be omitted herein.

The first injection hole DH1 may be disposed in an area where the inner tunnel TN is not disposed. The diameter ds1 of the first injection hole DH1 may be from about 0.4 mm to about 5 mm, and the pitch GP1 thereof may be from about 5 mm to about 50 mm. The diameter ds1 and pitch GP1 of the first injection hole DH1 may be substantially the same as or different from those of the second injection hole DH2. Even in the case of the first injection hole DH1, the first injection holes DH1 may be arranged at regular intervals along the first direction X and the second direction Y over the facing plate 120, so that the first reaction gas G1 can be uniformly injected into the reaction space RS.

In an exemplary embodiment of the present invention, the injection holes DH1 and DH2 including the first injection holes DH1 and the second injection holes DH2 may be regularly arranged along the first direction X and the second direction Y on the lower surface of the facing plate 120, but exemplary embodiments of the present invention are not limited thereto.

Figure 11:
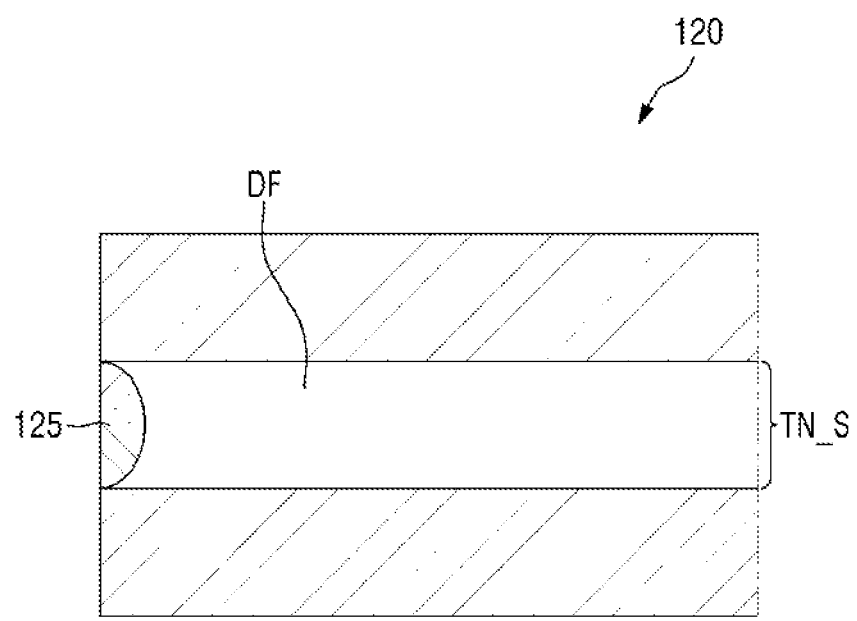
FIG. 11 is a cross-sectional view of an end portion of a facing plate of a showerhead according to an exemplary embodiment of the present invention.

FIG. 11 is a cross-sectional view of an end portion of a facing plate of a showerhead according to an exemplary embodiment of the present invention.

Referring to FIGS. 4 and 11, the facing plate 120 may include a sealing member 125 disposed at the ends of the main tunnel TN_M and the sub tunnel TN_S. The sealing member 125 may seal the ends of the main tunnel TN_M and the sub tunnel TN_S which are opened toward the side surface of the facing plate 120.

The sealing member 125 may include a seal filling pattern (see, e.g., FIG. 11) that partially fills the interior of the main tunnel TN_M and the sub-tunnel TN_S front the side surface of the facing plate 120. The outer side surface of the seal filling pattern may be aligned with the side surface of the facing plate 120 in which the inner tunnel TN is not formed by a method such as polishing, but exemplary embodiments of the present invention are not limited thereto.

In an exemplary embodiment of the present invention, a seal filling pattern of the sealing member 125 may include a same material as the facing plate 120. A seal filling pattern including a metal may be formed by welding. In an exemplary embodiment of the present invention, the seal filling pattern may include a resin.

Figure 12:
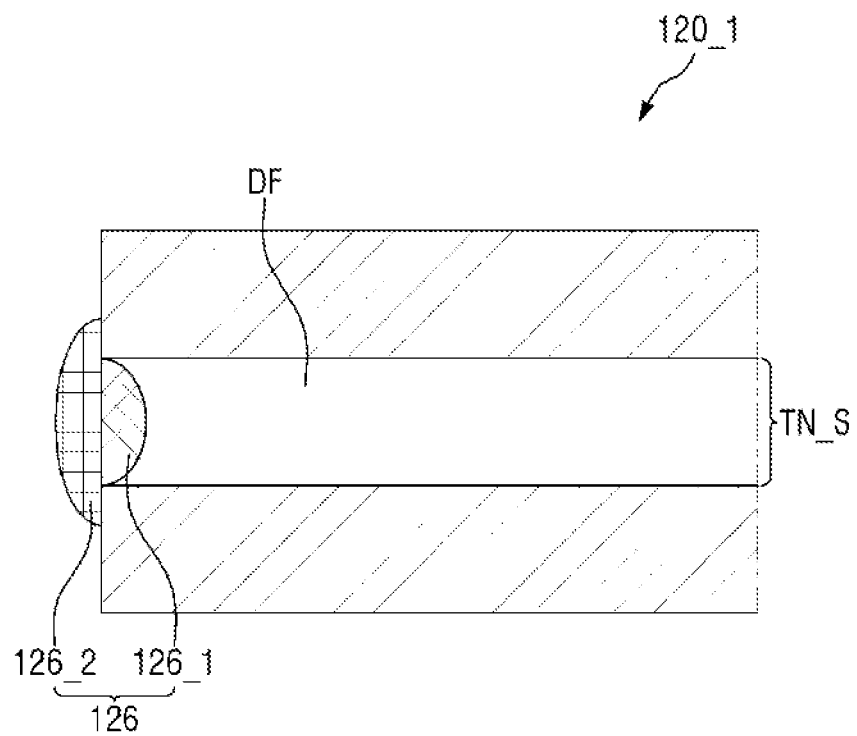
FIG. 12 is a cross-sectional view of an end portion of a facing plate of a showerhead according to an exemplary embodiment of the present invention.

FIG. 12 is a cross-sectional view of an end portion of a facing plate of a showerhead according to an exemplary embodiment of the present invention.

Referring to FIG. 12, a sealing member 126 may include an outer cover 126_2. The sealing member 126 of a facing plate 120_1 may include a seal filling pattern 126_1 and the outer cover 126_2. The seal filling pattern 126_1 may be substantially the same as the seal filling pattern described with reference to FIG. 11. The outer cover 126_2 may be disposed on the outer side of the seal filling pattern 126_1, and may protrude outward from the side surface of the facing plate 120 on which the inner tunnel TN is not formed. The outer cover 126_2 may include a same material as the seal filling pattern 126_1. The outer cover 126_2 may include a different material from the seal filling pattern 126_1.

The outer cover 126_2 may be disposed separately for each seal filling pattern 126_1, and may have a shape extending in a direction to simultaneously cover a plurality of seal filling patterns 126_1. For example, the outer cover 126_2 may extend along the side surface of the facing plate 120_1 across a plurality of openings.

Figure 13:
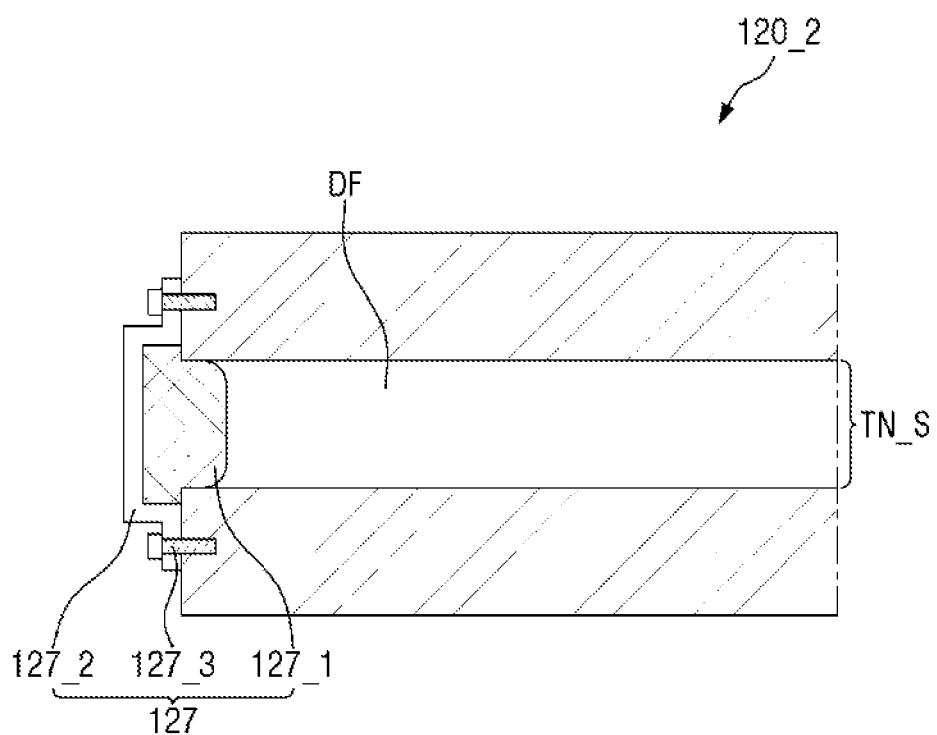
FIG. 13 is a cross-sectional view of an end portion of a facing plate of a showerhead according to an exemplary embodiment of the present invention.

FIG. 13 is a cross-sectional view of an end portion of a facing plate of a showerhead according to an exemplary embodiment of the present invention.

Referring to FIG. 13, a seal filling pattern 127_1 of a sealing member 127 may partially fill the inner channel TN and simultaneously protrude outward from the side surface of a facing plate 120_2 not provided with the inner tunnel TN. The sealing member 127 may include an outer cover 127_2 and a coupling member 127_3. The outer cover 127_2 may be disposed on the outer side of the seal filling pattern 127_1, and may be coupled to the facing plate 120_2 through the coupling member 127_3, such as a screw.

In an exemplary embodiment of the present invention, the seal filling pattern 127_1 may include a portion protruding outward from the side surface of the facing plate 120_2, so that patterns sealing a plurality of inner tunnels TN may be integrated with each other by using this portion.

A method of manufacturing a facing plate according to an exemplary embodiment of the present invention will be described in more detail below.

Figure 14:
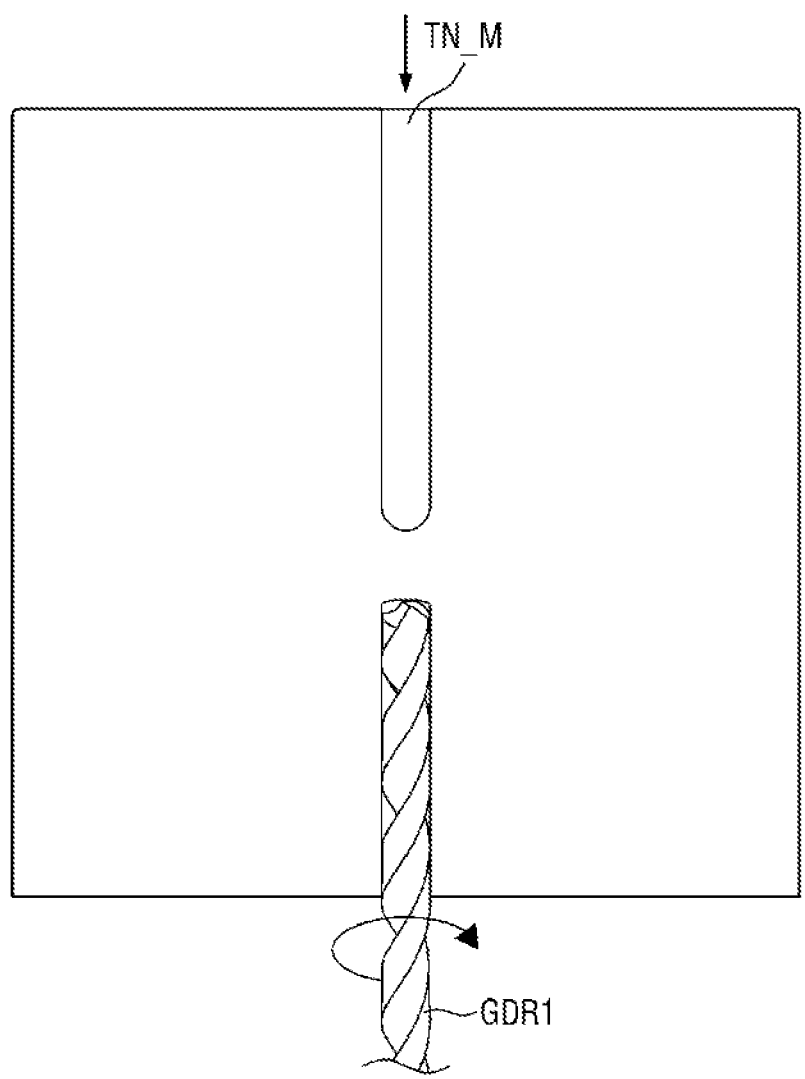
FIGS. 14 and 15 are plan views of a method of manufacturing a facing plate of a showerhead according to an exemplary embodiment of the present invention.
Figure 15:
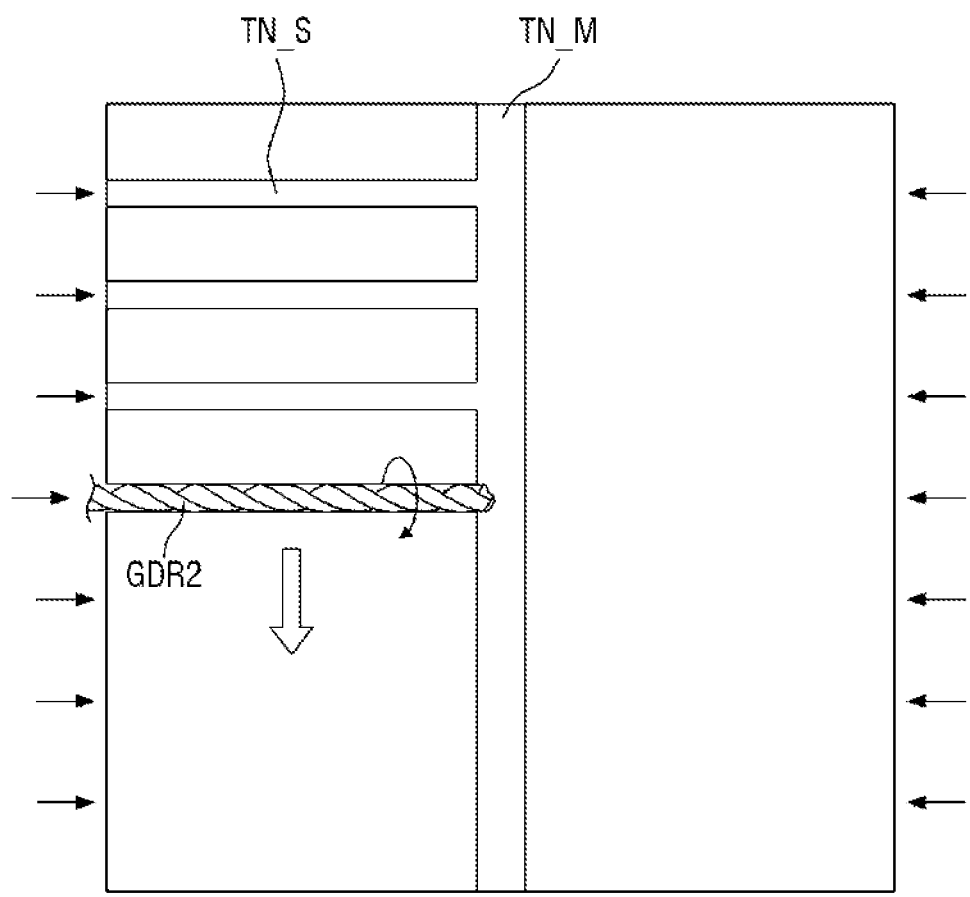

FIGS. 14 and 15 are plan views of a method of manufacturing a facing plate of a showerhead according to an exemplary embodiment of the present invention.

Referring to FIG. 14, in a method of forming a main tunnel TN_M of a facing plate, the main tunnel TN_M may be formed using a first gun drill GDR1. The main tunnel TN_M may be formed by forming a partial tunnel from one side surface of the facing plate to the center thereof by drilling using the first gun drill GDR1, drilling the other side surface of the facing plate to form another partial tunnel, and then connecting these partial tunnels to each other.

Referring to FIG. 15, in a method of forming sub tunnels TN_S of the facing plate, the sub tunnels TN_S may be formed using a second gun drill GDR2. The second gun drill GDR2 may have a smaller diameter than the first gun drill GDR1. In the formation of the sub tunnels TN_S, the drilling of the facing plate in which the main tunnel TN_M is formed may be performed from the other side surface of the facing plate, not provided with tunnel holes, to the main tunnel TN_M. Drilling processes for the respective sub-tunnels TN_S may be performed sequentially, but may be performed simultaneously using a plurality of second gun drills GDR2.

A process of forming a plurality of first injection holes and a plurality of second injection holes and sealing the ends of the main tunnel and the sub tunnels using a sealing member according to an exemplary embodiment of the present invention may be performed.

Figure 16:
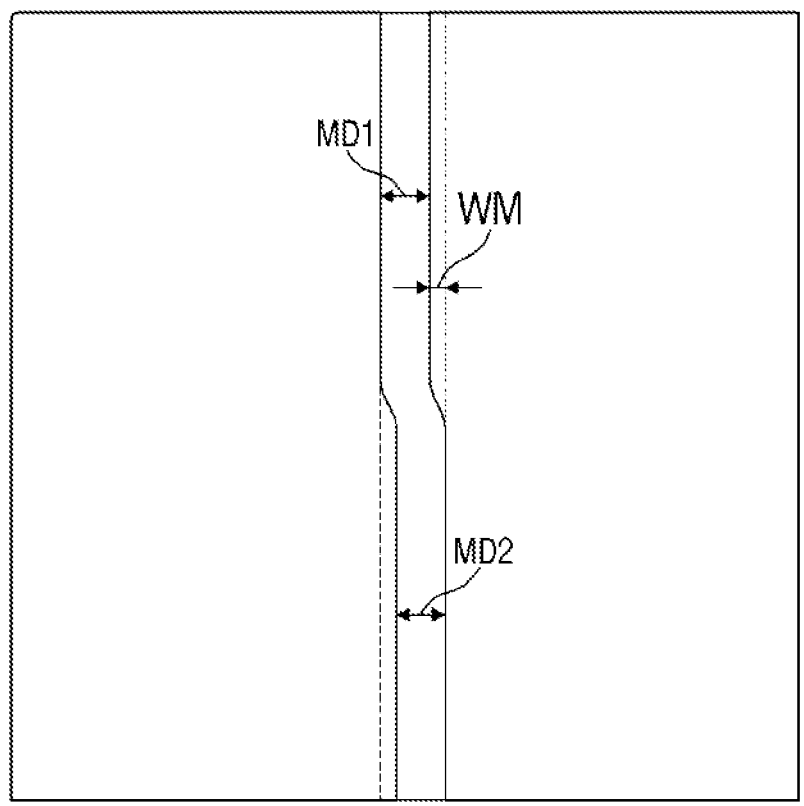
FIG. 16 is a schematic view of a planar shape of a main tunnel of a facing plate of a showerhead according to an exemplary embodiment of the present invention.

FIG. 16 is a schematic view of a planar shape of a main tunnel of a facing plate of a showerhead according to an exemplary embodiment of the present invention.

Referring to FIG. 16, the extending direction of a portion located at one side of the center of the main tunnel need not be aligned with the extending direction of a portion located at the other side thereof. This may be a result of misalignment occurring when drilling proceeds in both directions as in an exemplary embodiment of the present invention (see, e.g., FIG. 15). Despite partial misalignment, since drilling is performed by the same first gun drill GDR1, the diameter MD1 of one side of the main tunnel TN_M may be substantially equal to the diameter MD2 of the other side of the main tunnel TN_M.

Even when misalignment occurs, it is preferable that the misaligned width WM is less than half of the diameter MD1 or MD2 of the main tunnel TN_M. In an exemplary embodiment of the present invention, the misaligned width WM of the portion located at the other side of the center of the main tunnel TN_M with the respect to the extending direction of the portion located at one side thereof may be 1/10 or less the diameter MD1 or MD2 of the main tunnel TN_M.

Figure 17:
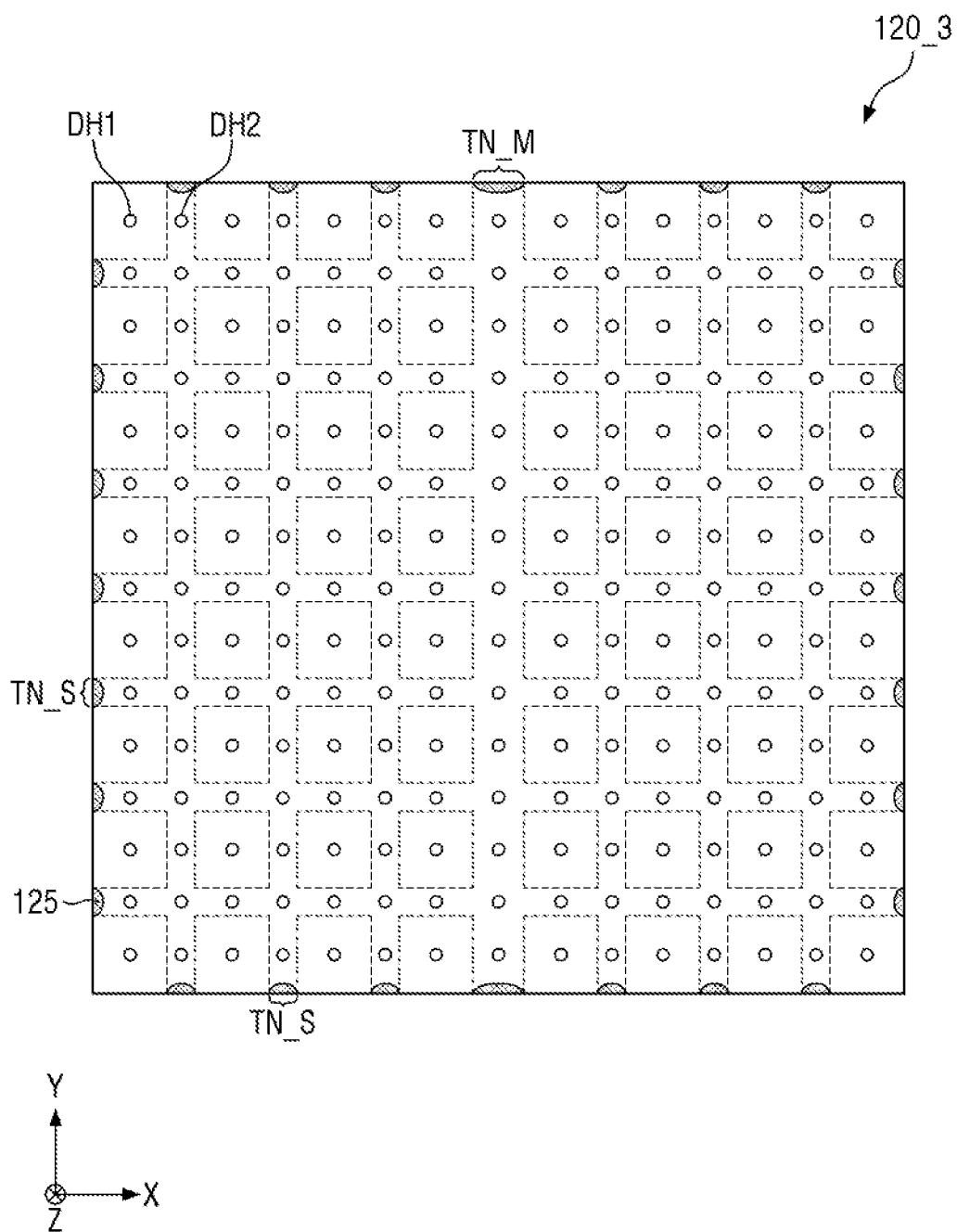
FIG. 17 is a bottom view of a facing plate of a showerhead according to an exemplary embodiment of the present invention.

FIG. 17 is a bottom view of a facing plate of a showerhead according to an exemplary embodiment of the present invention.

Referring to FIG. 17, a facing plate 120_3 according to an exemplary embodiment of the present invention may be different from the facing plate 120 of FIG. 4 in that the facing plate 120_3 further includes sub tunnels TN_S extending in the second direction Y.

For example, the facing plate 120_3 may include sub tunnels TN_S extending in the second direction Y as well as sub tunnels TN_S extending in the first direction X. The respective sub channels TN_S may be connected to each other at the intersections of the sub-tunnels TN_S extending in the first direction X and the sub-tunnels TN_S extending in the second direction Y.

In an exemplary embodiment of the present invention, the facing plate 120_3 may further include the sub tunnels TN_S extending in the second direction Y, thus further uniformly diffusing the second reaction gas G2 in the facing plate 120_3.

Figure 18:
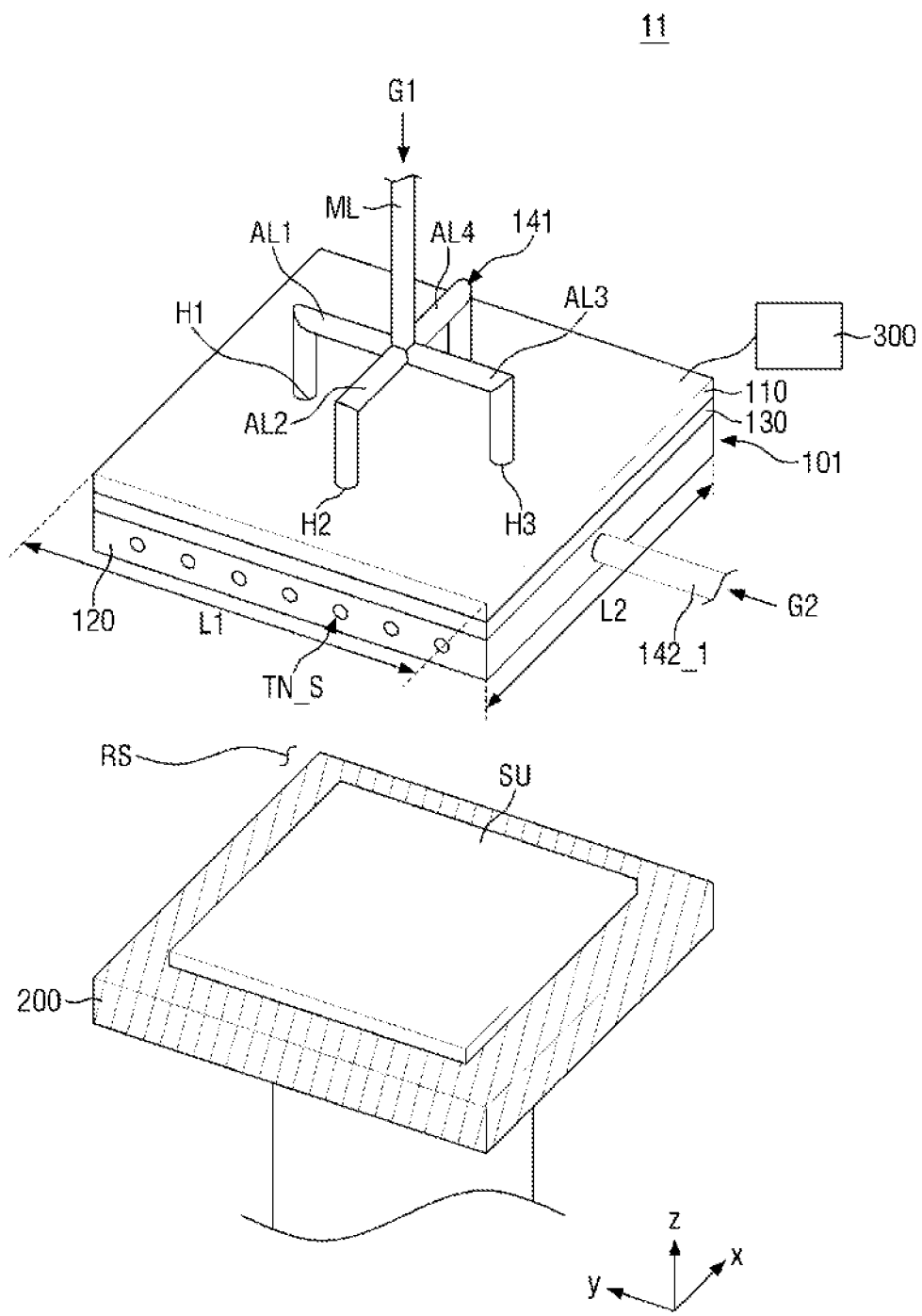
FIG. 18 is a perspective view of a thin film processing apparatus according to an exemplary embodiment of the present invention.

FIG. 18 is a perspective view of a thin film processing apparatus according to an exemplary embodiment of the present invention.

A thin film processing apparatus 11 according to an exemplary embodiment of the present invention may be different from the thin film processing apparatus 10 in that an inflow opening of a facing plate 120 of a showerhead 101 may be formed in the side surface of the facing plate 120.

Referring to FIG. 18, the end of the main tunnel TN_M may be utilized as an inflow opening (see, e.g., 'FOP' in FIG. 7). Opposite ends of the main tunnel TN_M may be opened when the main tunnel TN_M is formed by drilling. Thus, it is possible to connect a flow pipe of a second gas supply 142_1 in an open state instead of disposing the sealing member 125 at at least one opened end. The flow pipe of the second gas supply unit 142_1 may be connected to one end of the main tunnel TN_M. However, the flow pipe of the second gas supply unit 142_1 may be connected to both ends of the main tunnel TN_M. Further, the inflow opening FOP penetrating the fifth through-hole H5 and the cover area TNC_M of the main tunnel TN_M (see, e.g., FIG. 1) may be applied in combination.

Figure 19:
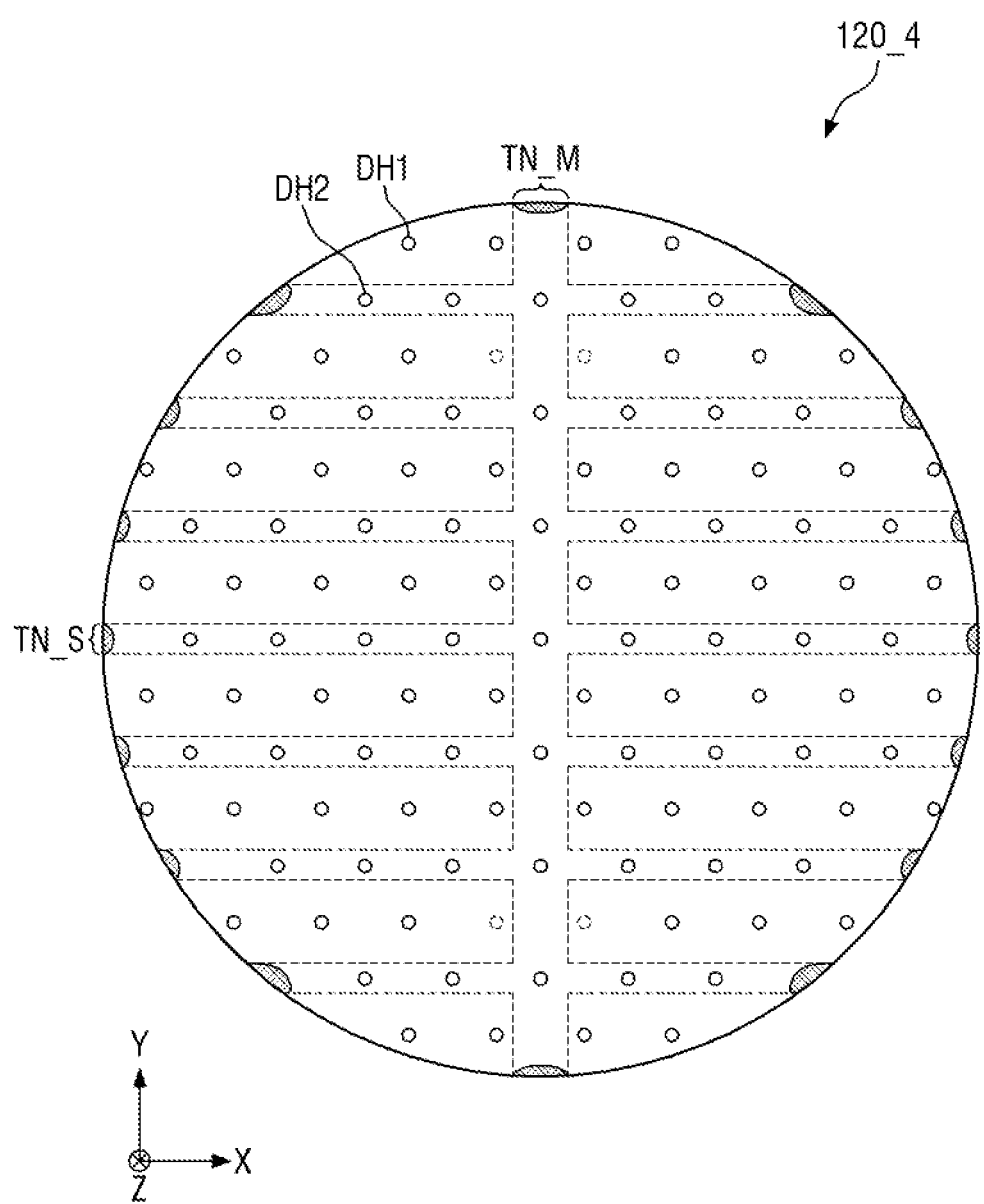
FIG. 19 is a bottom view of a facing plate of a showerhead according to an exemplary embodiment of the present invention.

FIG. 19 is a bottom view of a facing plate of a showerhead according to an exemplary embodiment of the present invention.

Referring to FIG. 19, a facing plate 120_4 may be formed to have a circular shape in a plan view (e.g., along the third direction Z). The shape of the facing plate 120_4, and a shape of the showerhead, may conform to the shape of the target substrate SU. For example, when the target substrate SU is a circular wafer, a circular facing plate 120_4 may be applied. The diameter of the facing plate 120_4 may be from about 100 mm to about 1,000 mm, but exemplary embodiments of the present invention are not limited thereto.

Since the facing plate 120_4 is formed in a circular shape, the respective sub tunnels TN_S may have different extension lengths depending on positions in the circular shape.

Figure 20:
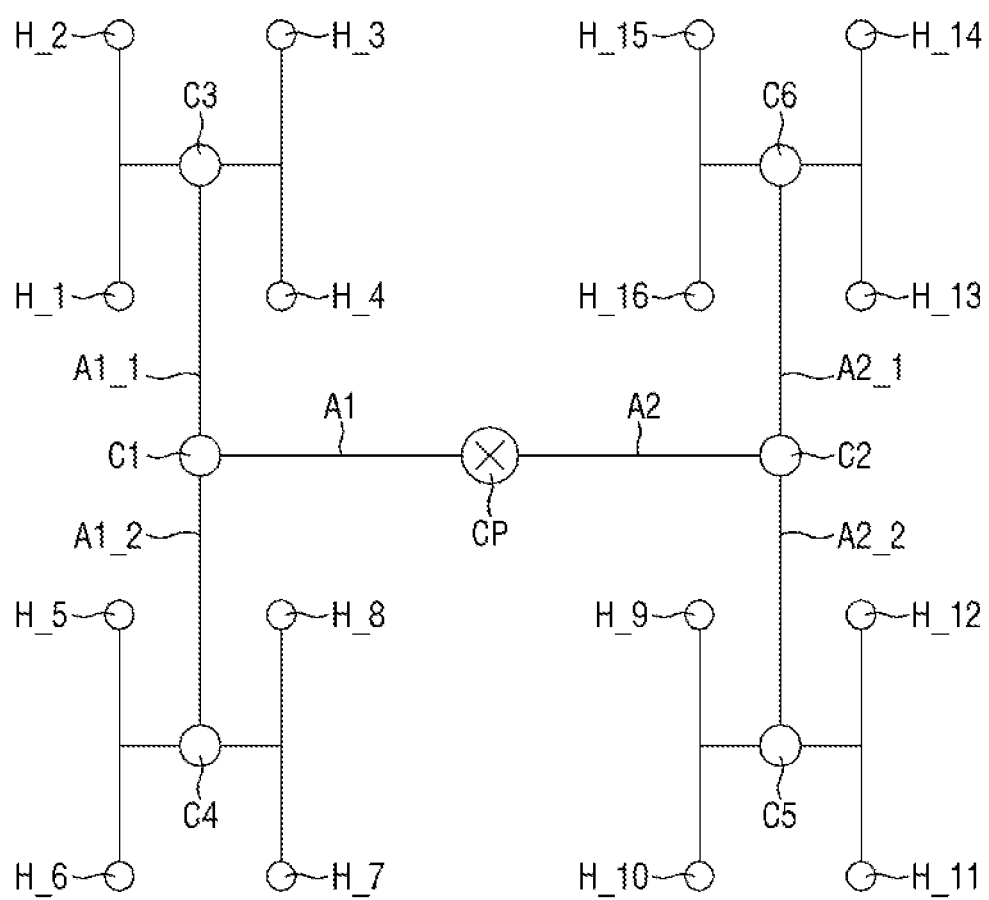
FIG. 20 is a schematic view of a movement path of a first reaction gas in a flow pipe of a first gas supply unit according to an exemplary embodiment of the present invention.

FIG. 20 is a schematic view of a movement path of a first reaction gas in a flow pipe of a first gas supply unit according to an exemplary embodiment of the present invention.

Referring to FIG. 20, the flow pipe of the first gas supply unit may be branched a plurality of times.

According to an exemplary embodiment of the present invention, the first gas supply unit (e.g., gas supply unit 141) may discharge a reaction gas through sixteen outlets H_1 to H_16. The respective path lengths from the main line ML to the outlets H_1 to H_16 of the respective auxiliary lines may be substantially the same as each other. As an example, the path lengths from the central branch point CP to the outlets H_1 to H_16 of the respective auxiliary lines may be substantially the same as each other.

As an example, the first reaction gas G1 provided along the main line ML may be separated into the first line A1 and the second line A2 at the central branch point CP. The first reaction gas G1 moving along the first line A1 may be separated into the 1-1 line A1_1 and the 1-2 line A1_2 lines at the first branch point C1.

The first reaction gas G1 moving along the 1-1 line A1_1 may be branched at the third branch point C3 to be substantially uniformly discharged to the first outlet H_1, the second outlet H_2, the third outlet H_3, and the fourth outlet H_4.

Similarly, the first reaction gas G1 moving along the 1-2 line A1_2 may be branched at the fourth branch point C4 to be substantially uniformly discharged to the fifth outlet H_5, the sixth outlet H_6, the seventh outlet H_7, and the eighth outlet H_8.

The first reaction gas G1 having moved to the second line A2 may be branched at the second branch point C2 and move to the 2-1 line and the 2-2 line A2_2.

The first reaction gas G1 moving along the 2-1 line A2_1 may be branched at the sixth branch point C6 to be substantially uniformly discharged to the thirteenth outlet H_13, the fourteenth outlet H_14, the fifteenth outlet H_15, and the sixteenth outlet H_16.

Similarly, the first reaction gas G1 moving along the 2-2 line A2_2 may be branched at the fifth branch point C5 to be substantially uniformly discharged to the ninth outlet H_9, the tenth outlet H_10, the eleventh outlet H_11, and the twelfth outlet H_12.

The metal precursor included in the first reaction gas G1 may be relatively heavy in mass, and thus might not be easily dispersed uniformly. As described above, when the plurality of outlets H_1 to H_16 are distributed on a plane and the path length from the central branch point CP to each of the outlets H_1 to H_16 is substantially constant, the metal precursor may be substantially uniformly dispersed to form a uniform metal oxide film on a large-area substrate.

Figure 21:
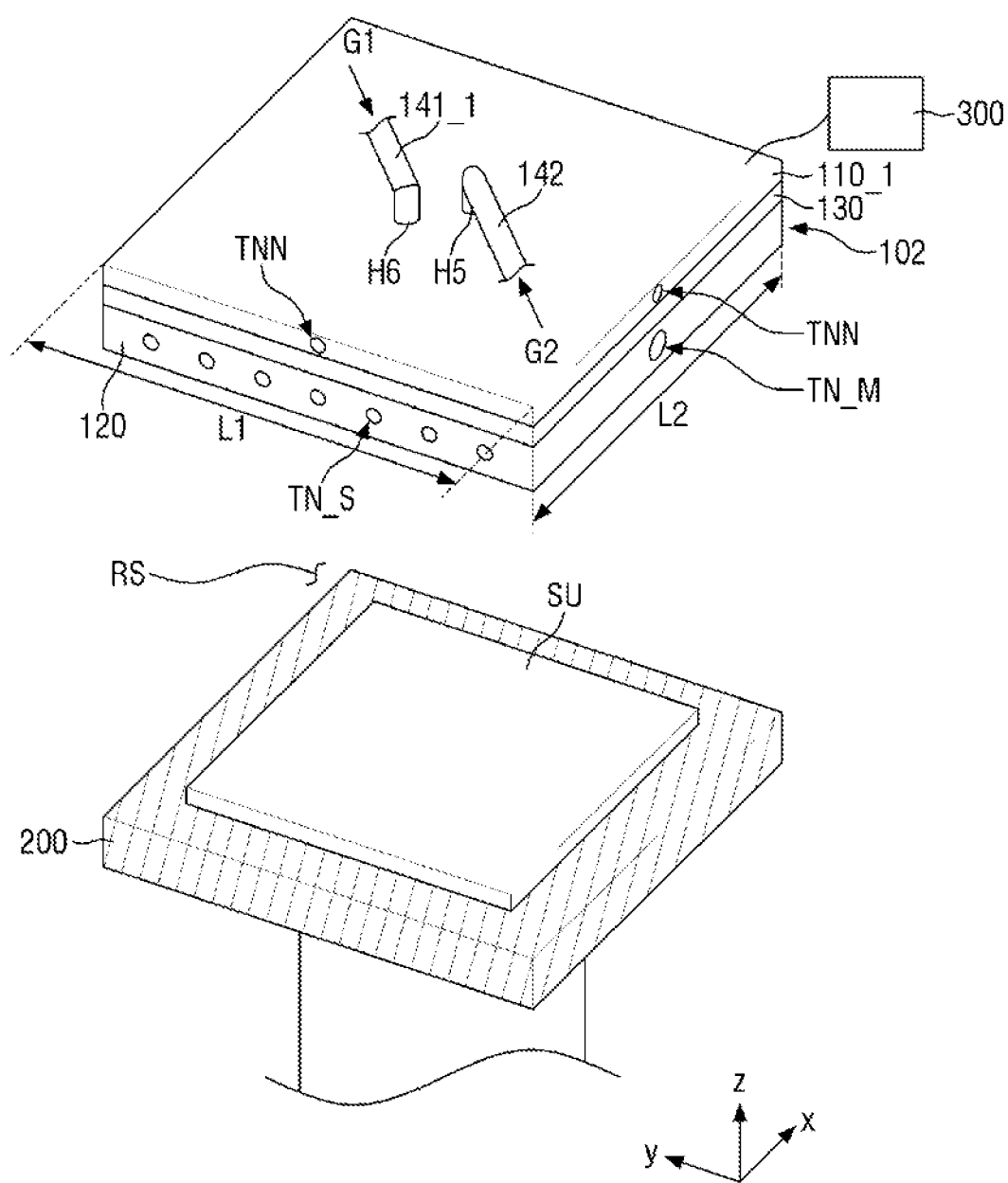
FIG. 21 is a perspective view of a thin film processing apparatus according to an exemplary embodiment of the present invention.
Figure 22:
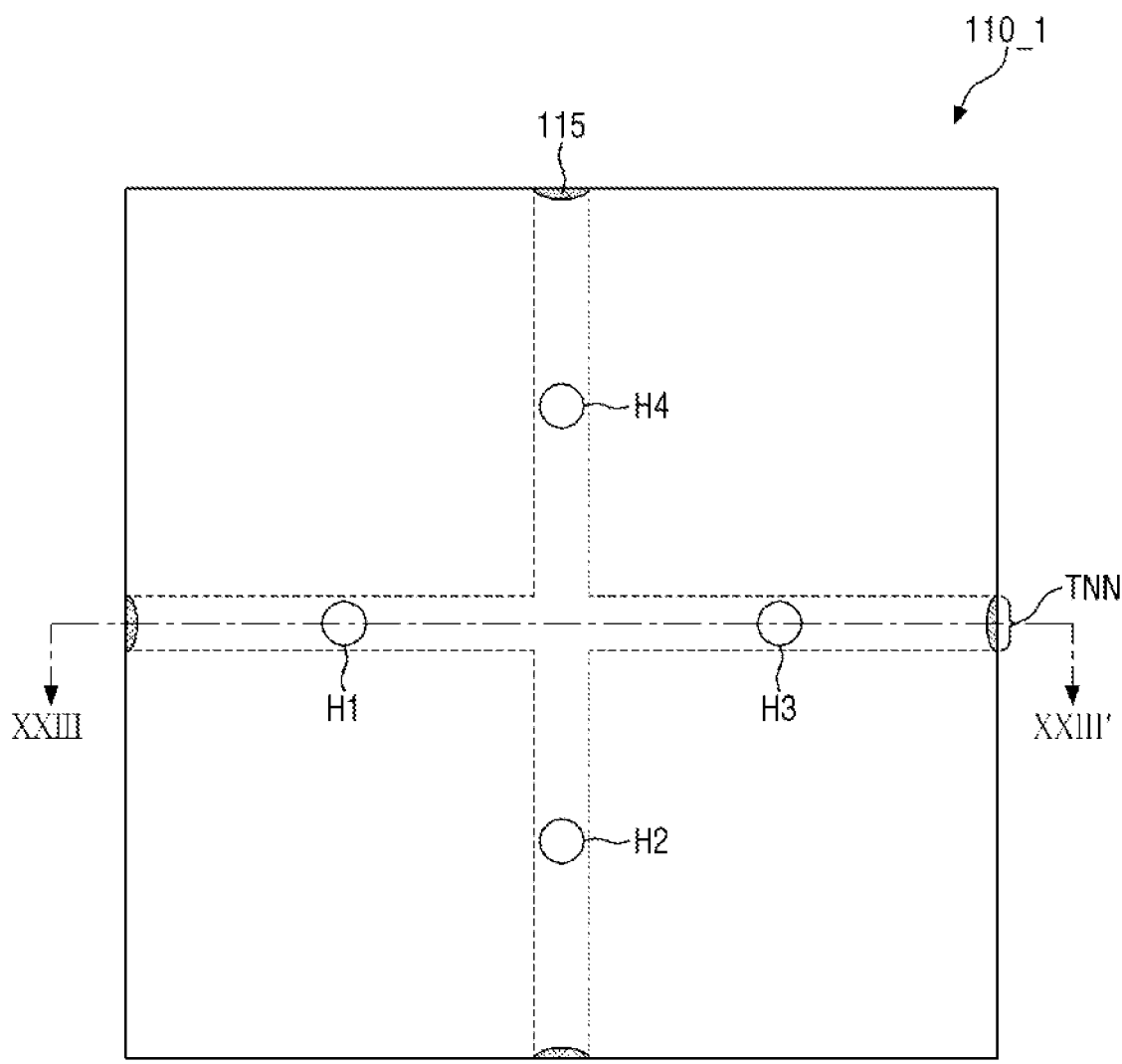
FIG. 22 is a bottom view of a facing plate of a showerhead of FIG. 21 according to an exemplary embodiment of the present invention.
Figure 23:
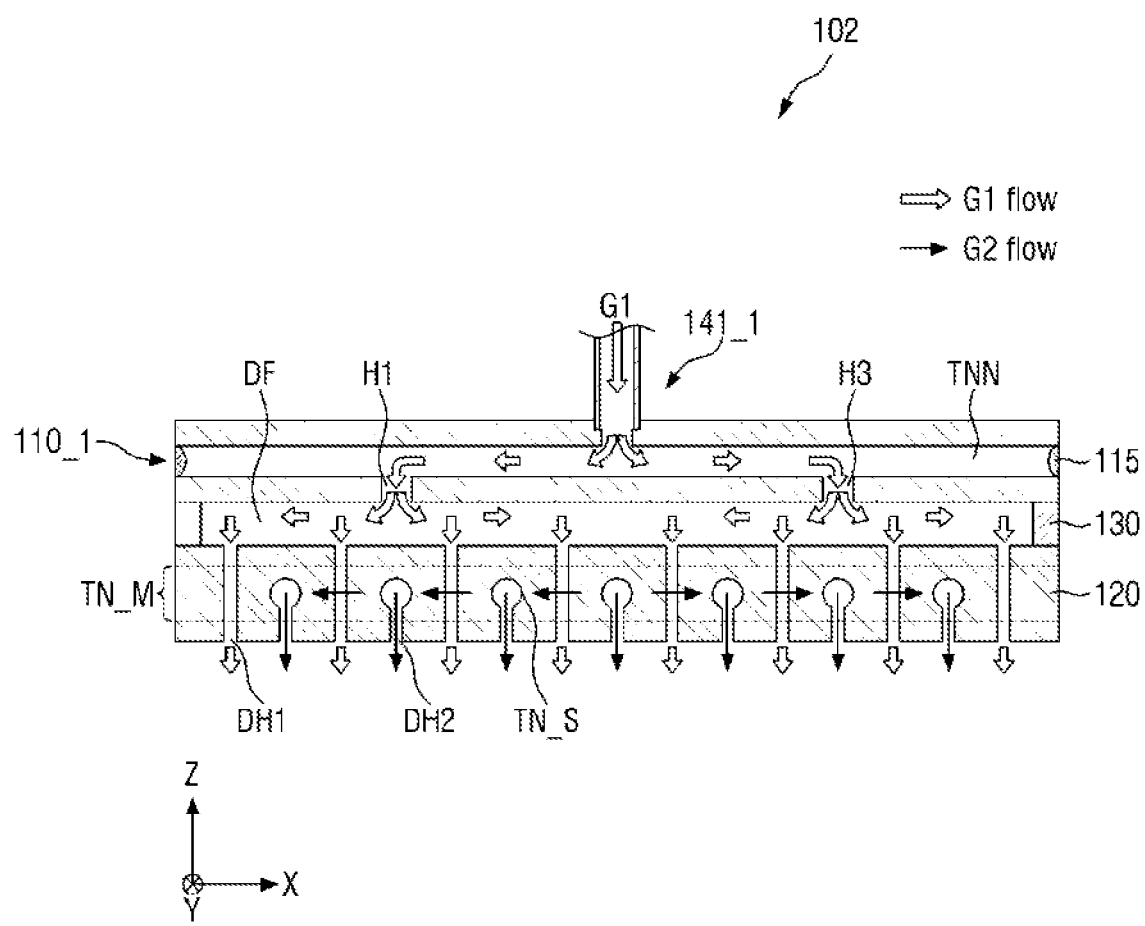
FIG. 23 is a cross-sectional view taken along the line XXIII-XXIII' of FIG. 22.

FIG. 21 is a perspective view of a thin film processing apparatus according to an exemplary embodiment of the present invention. FIG. 22 is a bottom view of a facing plate of a showerhead of FIG. 21 according to an exemplary embodiment of the present invention. FIG. 23 is a cross-sectional view taken along the line XXIII-XXIII' of FIG. 22.

In an exemplary embodiment of the present invention, a thin film processing apparatus 12 may include a back plate 110_1 of a showerhead 102. The back plate 110_1 may include an inner tunnel TNN.

Referring to FIGS. 21 to 23, the back plate 110_1 may include an inner tunnel TNN extending across the thickness direction (e.g., along the third direction Z). In an exemplary embodiment of the present invention, the inner tunnel TNN of the track plate 110_1 may include a portion extending in the first direction X and a portion extending in the second direction Y. The portion extending in the first direction X and the portion extending in the second direction Y may be connected to each other at an intersection thereof. A sealing member 115 may be disposed at the end of the inner tunnel TNN.

The back plate 110_1 may include first to fourth through-holes H1, H2, H3, and H4 penetrating the back plate 110_1 from the inner tunnel TNN to the lower surface of the back plate 110_1 in the thickness direction, a sixth through-hole H6 penetrating the back plate 110_1 from the upper surface of the back plate 110_1 to the inner tunnel TNN in the thickness direction, and a fifth through-hole H5 penetrating the upper and lower surfaces of the back plate 110_1 in the thickness direction. The first to fourth through-holes H1, H2, H3, and H4 may be arranged at the same positions as the first to fourth through-holes H1, H2, H3, and H4 described with reference to FIGS. 1 to 3 in a plan view. The fifth through-holed H5 and the sixth through-hole H6 may be disposed at a central area of the back plate 110_1 in a plan view, while also being spaced apart from each other. The flow pipe of the first gas supply unit 141_1 may be connected to the sixth through-hole H6 to be connected to the inner tunnel TNN.

The first reaction gas G1 provided from the first gas supply unit 141_1 may be introduced into the inner tunnel TNN through the sixth through-hole 146 and then move to a portion of the inner tunnel TNN extending in the first direction X and a portion of the inner tunnel TNN extending in the second direction Y. This path corresponds to a path that is substantially the same as that branched from the main line ML to each of the auxiliary lines AL1, AL2, AL3, and AL4 as described with reference to FIGS. 1 to 3. The first reaction gas G1 having moved to the inner tunnel TNN may be provided to the diffusion space DF through the first to fourth through-holes H1, H2, H3, and H4. The movement path of the first reaction gas G1 may otherwise be substantially the same as that of the path described with reference to FIGS. 1 to 3, and thus duplicative descriptions may be omitted.

A thin film processing method according to an exemplary embodiment of the present invention will be described in more detail below.

A thin film processing method according to an exemplary embodiment of the present invention may be performed using the thin film processing apparatus according to an exemplary embodiment of the present invention described herein.

For example, the target substrate SU may be disposed on the susceptor 200, the first reaction gas G1 may be provided into the reaction space RS through the first gas supply unit 141, and the second reaction gas G2 may be provided into the reaction space RS through the second gas supply unit 142. The first reaction gas G1 and the second reaction gas G2 do not meet each other until they are injected into the reaction space RS. For example, the first reaction gas G1 may be introduced into the diffusion space DF between the back plate 110 and the facing plate 120, and may be introduced into the reaction space RS thorough the first injection hole DH1 provided in the facing plate 120. The second reaction gas G2 may be introduced into the inner tunnel TN of the facing plate 120, and may be introduced into the reaction space RS thorough the second injection hole DH2 connected to the inner tunnel TN. Since the inner tunnel TN of the facing plate 120 and the second injection hole DH2 are isolated from the diffusion space DF and the first injection hole DH1, the second reaction gas G2 need not meet the first reaction gas G1 until the second reaction gas G2 is provided to the reaction space RS through the showerhead 100.

The first reaction gas G1 and the second reaction gas G2 may be introduced substantially simultaneously, or may be introduced alternately.

The first reaction gas G1 and the second reaction gas G2 provided in the reaction space RS can be used for a thin film process such as an oxide film deposition on the target substrate SU.

According to an exemplary embodiment of the present invention, when the facing plate 120 includes a single plate, an occurrence of thermal deformation may be reduced or eliminated even if a relativity high-temperature process is performed, thus reducing or eliminating an occurrence of a defect caused by the thermal deformation.

As described herein, according to an exemplary embodiment of the present invention, an occurrence of a thermal deformation of a showerhead may be reduced or eliminated. Further, a plurality of reaction gases can be injected into a reaction space in a state of being isolated from each other.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A thin film processing apparatus, comprising:
   susceptor; and
   a showerhead facing the susceptor, the showerhead including a first plate including an inner tunnel, a first injection hole, and a second injection hole,
   wherein the first injection hole penetrates a first surface and a second surface of the first plate on opposite sides of the first plate in a direction orthogonal to the first surface of the first plate,
   wherein the it tunnel extends in a direction crossing the direction orthogonal to the first surface of the first plate, and the second injection hole penetrates the second surface of the first plate and is connected with the inner tunnel,
   wherein the first plate is formed of a single plate, and
   wherein an end of the inner tunnel includes an opening facing a side surface of the first plate between the first surface and the second surface of the first plate, and the inner tunnel further includes a sealing member sealing the opening of the inner tunnel.

2. The thin film processing apparatus of claim 1, wherein the first injection hole is unconnected with the inner tunnel and the second injection hole in the showerhead.

3. A thin film processing apparatus, comprising:
   susceptor; and
   a showerhead facing the susceptor, the showerhead including a first plate including an inner tunnel, a first injection bole, and a second injection hole,
   wherein the first injection hole penetrates a first surface and a second surface of the first plate on opposite sides of the first plate in a direction orthogonal to the first surface of the first plate,
   wherein the inner tunnel extends in a direction crossing the direction orthogonal to the first surface of the first plate, and the second injection hole penetrates the second surface of the first plate and is connected with the inner tunnel, and
   wherein the inner tunnel includes a main tunnel extending in a first direction and a sub tunnel extending in a second direction intersecting the first direction.

4. The thin film processing apparatus of claim 3, further comprising:
   a second plate disposed on the first plate to overlap the first plate,
   wherein the first plate is disposed between the second plate and the susceptor, and a diffusion space is defined between the first plate and the second plate.

5. The thin film processing apparatus of claim 4, wherein a reaction space is defined between the first plate and the susceptor, and the first plate faces the reaction space.

6. The thin film processing apparatus of claim 4, wherein the diffusion space is connected to the first injection hole, and is unconnected with the inner tunnel and the second injection hole.

7. The thin film processing apparatus of claim 4, further comprising:
   a first gas supply unit providing a first reaction gas to the showerhead; and
   a second gas supply unit providing a second reaction gas to the showerhead.

8. The thin film processing apparatus of claim 7, wherein the first reaction gas includes a metal precursor of at least one selected from zirconium, hafnium, or titanium, and the second reaction gas includes oxygen or nitrous oxide.

9. The thin film processing apparatus of claim 8, wherein the thin film processing apparatus is a deposition apparatus.

10. The thin film processing apparatus of claim 7, wherein the first gas supply unit includes a first flow pipe, and the second plate includes a first gas through-hole penetrating the second plate in the direction orthogonal to the first surface of the first plate, and the first flow pipe is connected to the diffusion space through the first gas through-hole.

11. The thin film processing apparatus of claim 10, wherein the first flow pipe includes a main line and a plurality of auxiliary lines branched from the main line and connected to the first gas through-hole.

12. The thin film processing apparatus of claim 7, wherein the second gas supply unit includes a second flow pipe, the second plate includes a second gas through-hole penetrating the second plate in the direction orthogonal to the first surface of the first plate, the first plate includes an inflow opening exposing the main tunnel of the first plate, and the second flow pipe traverses the second gas through-hole and the diffusion space to be connected to the inflow opening.

13. The thin film processing apparatus of claim 7, wherein the second gas supply unit includes a second flow pipe, an end of the main tunnel of the first plate faces a side surface of the first plate positioned between the first surface and the second surface of the first plate, and the second flow pipe is connected to the end of the main tunnel.

14. The thin film processing apparatus of claim 4, wherein the inner tunnel of the first plate is a first inner tunnel, and the second plate includes a second inner tunnel extending in a direction crossing the direction orthogonal to the first surface of the first plate.

15. The thin film processing apparatus of claim 3, wherein a diameter of the main tunnel is larger than a diameter of the sub tunnel, and the diameter of the sub tunnel is larger than a diameter of the second injection hole.

16. The thin film processing apparatus of claim 15, wherein the diameter of the main tunnel is from about 20 mm to about 40 mm, the diameter of the sub tunnel is from about 5 mm to about 20 mm and the diameter of the second injection hole is from about 0.4 mm to about 5 mm.

17. The thin film processing apparatus of claim 1, wherein the inner tunnel is formed by drilling.

18. A thin film processing apparatus, comprising:
   susceptor; and
   a showerhead facing the susceptor, the showerhead including:
      a first plate including an inner tunnel extending in a direction crossing a thickness direction of the first plate; and
      a second plate facing the first plate and defining a diffusion space between the first plate and the second plate,
   wherein the inner tunnel includes a main tunnel extending in a first direction and a sub tunnel extending in a second direction intersecting the first direction, and
   wherein the first plate is disposed between the second plate and the susceptor, and the first plate further includes a first injection hole penetrating a first surface and a second surface of the first plate in the thickness direction and a second injection hole penetrating the second surface of the first plate in the thickness direction from the inner tunnel.

19. A showerhead of a thin film processing apparatus, comprising:
   a first plate;
   a second plate spaced apart from the first plate;
   an edge sidewall connecting the first plate with the second plate;

a first gas supply unit connected with a diffusion space defined between the first plate, the second plate and the edge sidewall, wherein the diffusion space is connected with a first injection hole; and a second gas supply unit including, a connecting pipe passing through the diffusion space, wherein the connecting pipe is connected with a second injection hole spaced apart from the first injection hole, and wherein the connecting pipe is isolated from the diffusion space.

20. The showerhead of claim 19, wherein the first injection hole is isolated from the second injection hole in the first plate.

\* \* \* \* \*